(12) United States Patent
Monson

(10) Patent No.: US 11,262,853 B2
(45) Date of Patent: Mar. 1, 2022

(54) MEASURING CAPACITANCE

(71) Applicant: Cirque Corporation, Salt Lake City, UT (US)

(72) Inventor: Brian Monson, Farmington, UT (US)

(73) Assignee: Cirque Corporation, Sandy, UT (US)

( * ) Notice: Subject to any disclaimer, the term of this patent is extended or adjusted under 35 U.S.C. 154(b) by 0 days.

(21) Appl. No.: 16/814,000

(22) Filed: Mar. 10, 2020

(65) Prior Publication Data

US 2021/0286438 A1    Sep. 16, 2021

(51) Int. Cl.
*G06F 3/02* (2006.01)
*G06F 3/01* (2006.01)
*G01L 1/16* (2006.01)

(52) U.S. Cl.
CPC ............. *G06F 3/021* (2013.01); *G01L 1/16* (2013.01); *G06F 3/016* (2013.01); *G06F 3/0221* (2013.01)

(58) Field of Classification Search
CPC ...... H01H 3/122; H01H 13/705; H01H 11/04; H01H 2221/026; H01H 2237/00; H01H 2221/04; H03K 17/9622; H03K 17/975; Y10T 29/49105
See application file for complete search history.

(56) References Cited

U.S. PATENT DOCUMENTS

| | | |
|---|---|---|
| 3,696,908 A | 10/1972 | Gluck |
| 5,616,897 A | 4/1997 | Weber |
| 7,193,613 B2 | 3/2007 | Jam |
| 8,314,722 B2 | 11/2012 | Lanceros Mendez |
| 10,120,418 B2 | 11/2018 | Lee |
| 2005/0275637 A1 | 12/2005 | Hinckley |
| 2009/0058829 A1 | 3/2009 | Kim |
| 2013/0127791 A1 | 5/2013 | Siuta |
| 2013/0157726 A1* | 6/2013 | Miyazaki .............. G06F 1/3231 455/566 |
| 2014/0034468 A1* | 2/2014 | Krumpelman ......... H01H 3/122 200/5 A |
| 2014/0320383 A1 | 10/2014 | Goto |
| 2015/0277620 A1 | 10/2015 | Bulea |
| 2016/0357354 A1* | 12/2016 | Chen ....................... G06F 3/167 |
| 2017/0076502 A1 | 3/2017 | Chen |
| 2017/0090597 A1* | 3/2017 | Silvanto ................ G06F 3/0416 |
| 2019/0302889 A1 | 10/2019 | Salada |

FOREIGN PATENT DOCUMENTS

WO    2004015684    2/2004

\* cited by examiner

*Primary Examiner* — Shaheda A Abdin

(57) ABSTRACT

An apparatus may include an input surface, a plurality of key positions on the input surface, a force sensor positioned underneath the input surface at at least one of the key positions, and a proximity controller in communication with a capacitance measuring circuit incorporated into the apparatus.

10 Claims, 19 Drawing Sheets

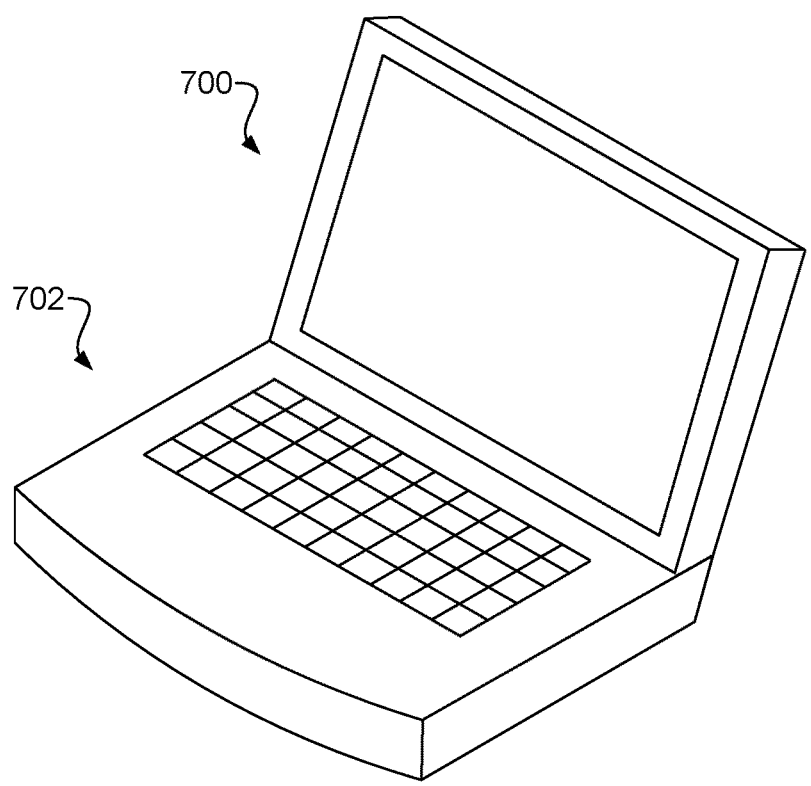
Fig. 7
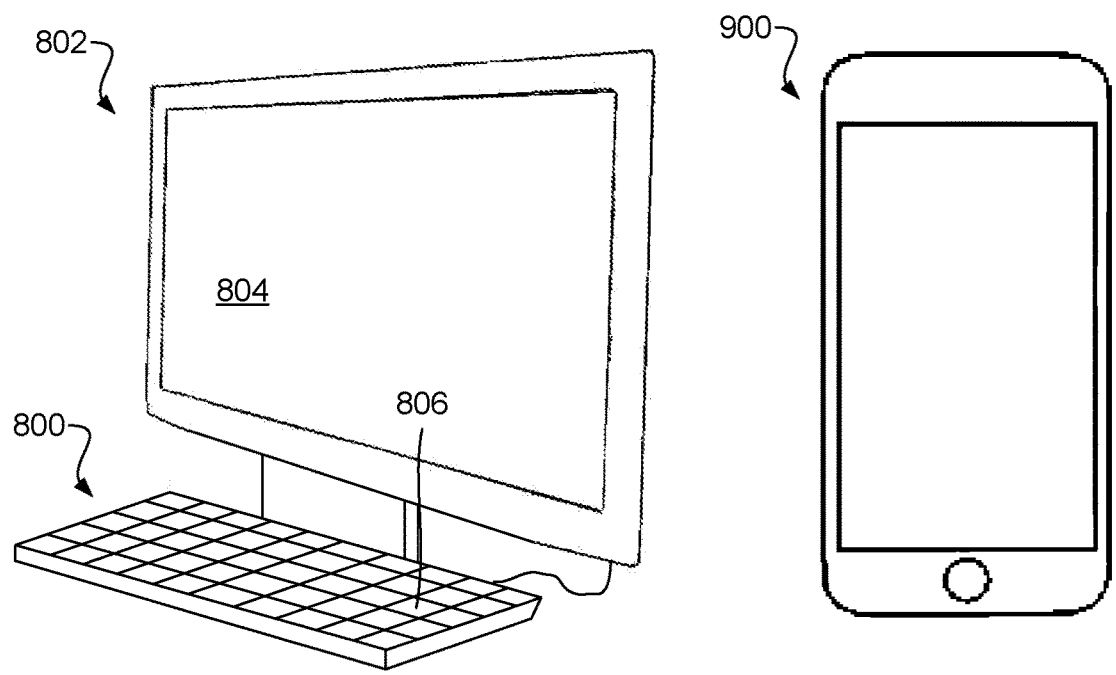
Fig. 8
Fig. 9

MEASURING CAPACITANCE

BACKGROUND

The present invention relates to input devices such as for computing devices that have integrated or peripheral input devices. Generally, computing devices incorporate a keyboard that generally include an arrangement of keys where each key is connected to an electrical switch located under each key. Multiple transmit lines provide a voltage to one side of the switches associated with different keys. The other side of the switches are connected to different sense lines. When the switches close in response to a user depressing the keys, the respective transmit lines and sense lines are temporarily brought into contact. This temporary contact can be detected by measuring the voltage on the sense lines.

An example of a capacitive keyboard is disclosed in U.S. Pat. No. 3,696,908 issued to Julius Gluck, et al. This reference expressly teaches a capacitive keying device for use in an electronic keyboard. Depression of the key drives a stem which stresses a spring beyond the release threshold of a magnetic latch. A projectile is then fired, impacting upon a flexible sheet capacitor electrode. The resulting electrode deflection causes a momentary increase in capacitive coupling.

Another example of a keyboard is described in U.S. Pat. No. 8,314,722 issued to Senentxu Lanceros Mendez, et al. This reference expressly describes a keyboard based in a polymeric, copolymeric or composite film with piezo- and pyroelectric properties capable of receiving a tactile signal and giving a respond in the form of an electrical signal. The system described includes one or more keys, being each one of them made by a piezoelectric film with electric conductive contacts, transparent or not, above and below the piezoelectric film and with the inferior layer of grounded electrodes. The system allows the use of just one piezoelectric film without external power supply, the use of electrode connections which form the keys that converge in one side of the keyboard and are available in the spots to make the connection to the active filter circuits instead of amplifiers in the electronic readout, as well as the possibility of introduction of new functionalities in these keyboards identical to the ones of tactile sensors, upon distinction between a pyroelectric and a piezoelectric signal from a particular key, differing the signals generated by pressure variation or by temperature variation.

SUMMARY

In one embodiment of the present disclosure, an apparatus may include an input surface, a plurality of key positions on the input surface, a force sensor positioned underneath the input surface at at least one of the key positions, and a proximity controller in communication with force sensor.

The force sensor may be a piezoelectric sensor.

In some examples, the apparatus may include a processor, memory in communication with the processor, programmed instructions stored in the memory that, when executed, cause the processor to send a haptic feedback signal to the force sensor in response to a user input on the at least one key position.

The programmed instructions, when executed, may cause the processor to detect a user input pressing the at least one key position based on input from the proximity controller.

The programmed instructions, when executed, may cause the processor to detect hand gestures based on input from the proximity controller.

The programmed instructions, when executed, may cause the processor to detect a user input pressing the at least one key position based on input from the force controller.

The programmed instructions, when executed, may cause the processor to detect a user input pressing on the at least one key position without relative movement between the input surface and the at least one key position.

The input surface may be a roll up or foldable surface.

The plurality of key positions and the input surface may be made of a continuous material.

The force sensor may include an active material responsive to pressure; a first electrically conductive layer adjacent a first side of the active material; and a second electrically conductive layer adjacent a second side, opposite of the first side, of the active material. The first electrically conductive layer may be connected to a transmit electrode in communication with the proximity controller; and the second electrically conductive layer may be connected to a sense electrode in communication with the proximity controller.

In some examples, a method for measuring proximity may include measuring capacitance between a first portion of a force sensor and a second portion of the force sensor. The force sensor may include an active material responsive to pressure. The first portion may be a first electrically conductive layer adjacent a first side of the active material; and the second portion may be a second electrically conductive layer adjacent a second side, opposite of the first side, of the active material.

The active material may be selected from the group of piezoelectric materials, magnetostrictive materials, or combinations thereof.

The first portion of the force sensor and the second portion of the force sensor may be in communication with a proximity controller.

The force sensor may be incorporated into an input device. The input device may include an input surface, a plurality of key positions on the input surface, the force sensor positioned underneath the input surface at at least one of the key positions, and a proximity controller in communication with force sensor.

The method may include sending a haptic feedback signal to the force sensor in response to a user input on the at least one key position.

The method may include detecting a user input pressing the at least one key position based on input from the proximity controller.

The method may include detecting hand gestures based on input from the proximity controller.

The method may include detecting a user input pressing the at least one key position based on input from the force sensor.

The method may include detecting a user input pressing on the at least one key position based on the capacitance measurement from between portions of the force sensor without relative movement between the input surface and the at least one key position.

In some examples, a method for measuring proximity may include measuring capacitance between a first portion of a force sensor and a second portion of the force sensor.

In some examples, a method for measuring proximity may include measuring capacitance in an input device, detecting a pressure type user input at a key position located on a surface of the input device based on the measured capacitance, and sending haptic feedback at the key position with a force sensor located under the key position in response to detecting the pressure type user input.

In some examples, a computer-program product for controlling a computing device, may include a non-transitory computer-readable medium storing instructions executable by a processor to measure capacitance in an input device, detect a pressure type user input at a key position located on a surface of the input device based on the measured capacitance, and send haptic feedback at the key position with a force sensor located under the key position in response to detecting the pressure type user input.

In some examples, an apparatus may include an input surface, a plurality of key positions on the input surface, a force sensor positioned underneath the input surface at at least one of the key positions, and a proximity controller in communication with a capacitance measuring circuit incorporated into the apparatus.

The force sensor may be incorporated into the capacitance measuring circuit.

In some examples, no independently movable parts may be used to detect a user input and to provide haptic feedback.

BRIEF DESCRIPTION OF THE DRAWINGS

A further understanding of the nature and advantages of the present invention may be realized by reference to the following drawings. In the appended figures, similar components or features may have the same reference label.

FIG. 7 depicts an example of an input device according to the present disclosure.

FIG. 8 depicts an example of an input device according to the present disclosure.

FIG. 9 depicts an example of an input device according to the present disclosure.

DETAILED DESCRIPTION OF THE INVENTION

Figure 1:
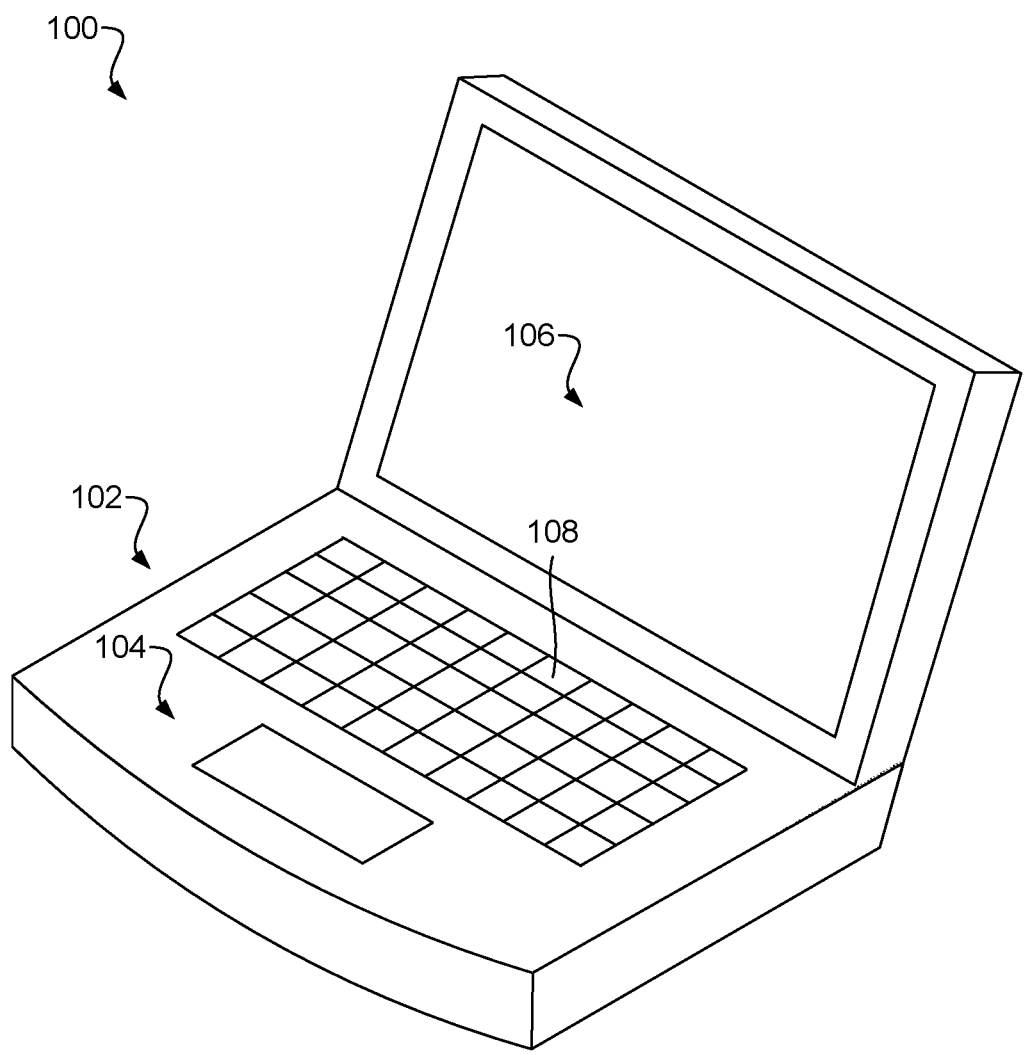
FIG. 1 depicts an example of an input device according to the present disclosure.

This description provides examples, and is not intended to limit the scope, applicability or configuration of the invention. Rather, the ensuing description will provide those skilled in the art with an enabling description for implementing embodiments of the invention. Various changes may be made in the function and arrangement of elements.

Thus, various embodiments may omit, substitute, or add various procedures or components as appropriate. For instance, it should be appreciated that the methods may be performed in an order different than that described, and that various steps may be added, omitted, or combined. Also, aspects and elements described with respect to certain embodiments may be combined in various other embodiments. It should also be appreciated that the following systems, methods, devices, and software may individually or collectively be components of a larger system, wherein other procedures may take precedence over or otherwise modify their application.

For purposes of this disclosure, the term "aligned" generally refers to being parallel, substantially parallel, or forming an angle of less than 35.0 degrees. For purposes of this disclosure, the term "transverse" generally refers to perpendicular, substantially perpendicular, or forming an angle between 55.0 and 125.0 degrees. For purposes of this disclosure, the term "length" generally refers to the longest dimension of an object. For purposes of this disclosure, the term "width" generally refers to the dimension of an object from side to side and may refer to measuring across an object perpendicular to the object's length.

For purposes of this disclosure, the term "electrode" generally refers to a portion of an electrical conductor intended to be used to make a measurement, and the terms "route" and "trace" generally refer to portions of an electrical conductor that are not intended to make a measurement. For purposes of this disclosure in reference to circuits, the term "line" generally refers to the combination of an electrode and a "route" or "trace" portions of the electrical conductor. For purposes of this disclosure, the term "Tx" generally refers to a transmit line, and the term "Rx" generally refers to a sense line.

For the purposes of this disclosure, the term "computing device" generally refers to electronic devices that include processors. Examples may include an electric vehicle, a hybrid vehicle, a laptop, a desktop, a mobile phone, an electronic tablet, a personal digital device, a watch, a gaming controller, personal digital devices, radios, flat panels, televisions, displays, other devices, or combinations thereof.

It should be understood that use of the terms "touch pad" and "touch sensor" throughout this document may be used interchangeably with "capacitive touch sensor," "capacitive sensor," "capacitive touch and proximity sensor," "proximity sensor," "touch and proximity sensor," "touch panel," "touchpad," and "touch screen." Further, for the purposes of this disclosure, the term "proximity controller" or "touch controller" is a logic device capable of receiving electrical measurements to determine changes in capacitance to determine whether an object is in proximity to a key position or another location. In some cases, the proximity controller may determine a distance the object is away from the key position or another location.

For the purposes of this disclosure, the term "haptic feedback" generally refers to providing a tactile feedback to the user. In some examples, the haptic feedback may be provided on the surface of the input device at the key position, and may take the form of vibrations. In those examples where the force sensor includes a piezoelectric material, an electrical stimulus may be provided to the piezoelectric material to cause vibrations or other types of movement which can be felt by a finger placed on the key position of the surface of the input device. In other examples with force sensors including other types of active materials, other types of stimuluses may be provided to cause vibrations or other types of movement to provide feedback to the user.

It should also be understood that, as used herein, the terms "vertical," "horizontal," "lateral," "upper," "lower," "left," "right," "inner," "outer," etc., can refer to relative directions or positions of features in the disclosed devices and/or assemblies shown in the Figures. For example, "upper" or "uppermost" can refer to a feature positioned closer to the top of a page than another feature. These terms, however, should be construed broadly to include devices and/or assemblies having other orientations, such as inverted or inclined orientations where top/bottom, over/under, above/below, up/down, and left/right can be interchanged depending on the orientation.

For the purposes of this disclosure, the term "key position" may generally refer to a position on a surface that a user may press as though the key position is a depressible key, but the key position is not configured to move independent of at least one additional key position on the surface of the input device. For example, two or more of the key positions may be made of a single material, and the response to pressing or hovering over the key positions may be triggered by capacitance and or force sensors located underneath the input surface. In some examples, all the key positions may be located on a unitary piece of material. In some cases, notwithstanding that the key position is not configured to move independently of at least one key position on the input surface, the surface of the input device may flex at the key position to transfer at least some pressure to a force sensor located underneath the surface of the input device. In embodiments where the key positions are not independently movable, an indicator may be used at the key position to identify the key position and its function. For example, a non-exhaustive list of indicators types that may be suitable with the present disclosure, but not limited to, may include decals, images, icons, brail, lights, protrusions, indents, wording, letters, numbers, symbols, other types of indicia, or combinations thereof.

Additionally, the term "key position" may generally refer to a depressible key configured to move inward in response to pressure from a user or another type of object pressing on the key. Such a depressible key may be configured to move independently of other keys incorporated into the keyboard or another type of input device. Such depressible keys may include springs or other types of mechanisms to cause the depressible key to return to its original position when the pressure on the key is removed.

FIG. 1 depicts an example of a computing device 100. In this example, the computing device is a laptop. In the illustrated example, the computing device 100 includes an input device, such as a keyboard 102, a touch pad 104, or combinations thereof. The computing device 100 also includes a display 106. A program operated by the computing device 100 may be depicted in the display 106 and controlled by a sequence of instructions that are provided by the user through the keyboard 102 and/or through the touch pad 104.

In the illustrated example, the keyboard 102 includes an arrangement of key positions 108 that can be individually selected when a user presses on a key position 108. In some examples, the key position 108 may not be independently movable with respect to the other key positions and/or another portion of the surface of the input device when the user presses on the key position 108. In such an example, while the key positions 108 may not be configured to move independently of each other, material at the key positions may flex under the pressure from the user's finger, which flexing may be detectable with a force sensor located underneath the input surface. Such flexing may not be visible to the user as he or she presses on the key positions 108. However, the user's finger or other object pressing on the key positions 108 may cause a change in a capacitance measurement between components located underneath the key position 108. In response to selecting a key position 108, a program may receive instructions on how to operate, such as a word processing program. A user may use the touch pad 104 to add different types of instructions to the programs operating on the computing device 100. For example, a cursor depicted in the display 106 may be controlled through the touch pad 104. A user may control the location of the cursor by sliding his or her hand along the surface of the touch pad 104. In some cases, the user may move the cursor to be located at or near an object in the computing device's display and give a command through the touch pad 104 to select that object. For example, the user may provide instructions to select the object by tapping the surface of the touch pad 104 one or more times.

Figure 2:
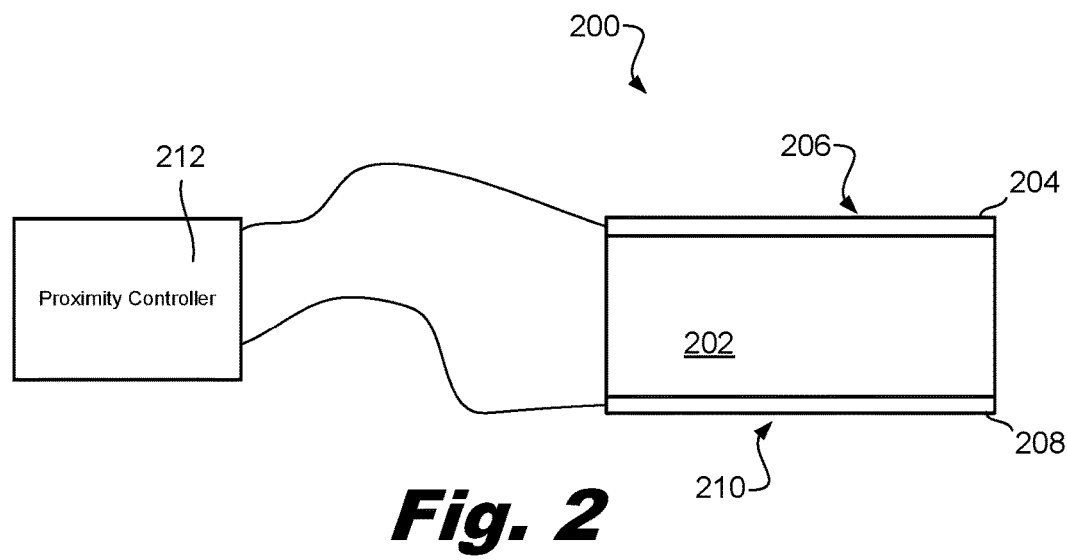
FIG. 2 depicts an example of a force sensor in communication with a proximity controller according to the present disclosure.

FIG. 2 depicts one example of a circuit that may be incorporated into the input device to detect when a user presses on a key position, performs a hand gesture at a distance spaced away from the input device, or receives haptic feedback at the key position. In this example, the force sensor 200 includes an active material 202, a first electrically conductive material 204 located on a first side 206 of the active material 202, and a second electrically conductive material 208 located on a second side 210, opposite of the first side 206, of the active material 202. The first electrically conductive material 204 and the second electrically conductive material 208 are each in communication with a proximity controller 212, which is programmed to measure the capacitance between the first electrically conductive material 204 and the second electrically conductive material 208. The active material 202 may exhibit a property change in response to being subjected to pressure. For example, the active material 202 may be a piezoelectric material so that when pressure is applied to the active material 202, the active material 202 may generate an electrical charge. In other examples, the active material may be a magnetostrictive material or another type of active material responsive to pressure.

The proximity sensor 212 may send a transmit signal to either the first or second electrically conductive material 204, 208, and measure with the other electrically conductive material a potential that can be used to determine the electrical capacitance between the first and second electrically conductive materials 204, 208. However, the measured capacitance may change when a finger or another electrically conductive object approaches the key position located over the force sensor 200. Thus, the presence of a finger on the key position may be detected by measuring the capacitance.

In some examples, hand gestures performed over the key positions are also detectable. Hand gestures may be performed near the input surface, but at a short distance spaced away from the surface of the input device. As a result, the amount of change in the capacitance measurement may be less causing the capacitance change signature resulting from a hand gesture to be different than the capacitance change signature resulting from a user pressing on the key position. In some examples, other differences in the capacitance change signatures may exist between the performance of a hand gesture and pressing on the key positions.

In some examples, when a user presses on the key position, the material of the input device's surface flexes enough to impart a pressure onto the force sensor 200. In this example, the active material of the force sensor 200 may be compressed resulting in the generation of an electrical charge, which can be detected. Thus, in the example of FIG. 2, a user pressing on the key position can be detected with either the change in measured capacitance with the proximity controller 212 or through the pressure exerted on the active material 202 measured with the force sensor 200. In some cases, circuitry to detect the electrical charges generated by the force sensor 200 may or may not be included. Additionally, in some examples, the capacitance circuitry may be programmed to just detect user inputs pressing on the key positions, just detect hand gestures executed over the key positions, or to detect both types of inputs.

In response to determining that a user has pressed a key position, a signal may be sent to the force sensor that causes the active material 202 to be electrically or magnetically energized that causes the active material 202 to vibrate or otherwise move. This vibration or other type of movement may be transferred back to the user's finger through the key position giving the user feedback that the key position was pressed. In some examples, the haptic feedback signal is sent to the force sensor through either the first or second electrically conductive material 204, 208. In some cases, the haptic feedback signal is sent on a different frequency than the transmit signal used to measure capacitance at the force sensor 200 to minimize or eliminate cross talk or other types of noise between the capacitance measuring function or the haptic feedback function. Additionally, in some embodiments, the haptic feedback signal may include a different signature than the transmit signal to enable the sense measurement to distinguish between a haptic feedback signal and a user pressing on a key position. In some examples, the haptic feedback signal may be imposed on the active material 202 through a different electrical connection than through the first or second electrically conductive materials 204, 208.

Figure 3:
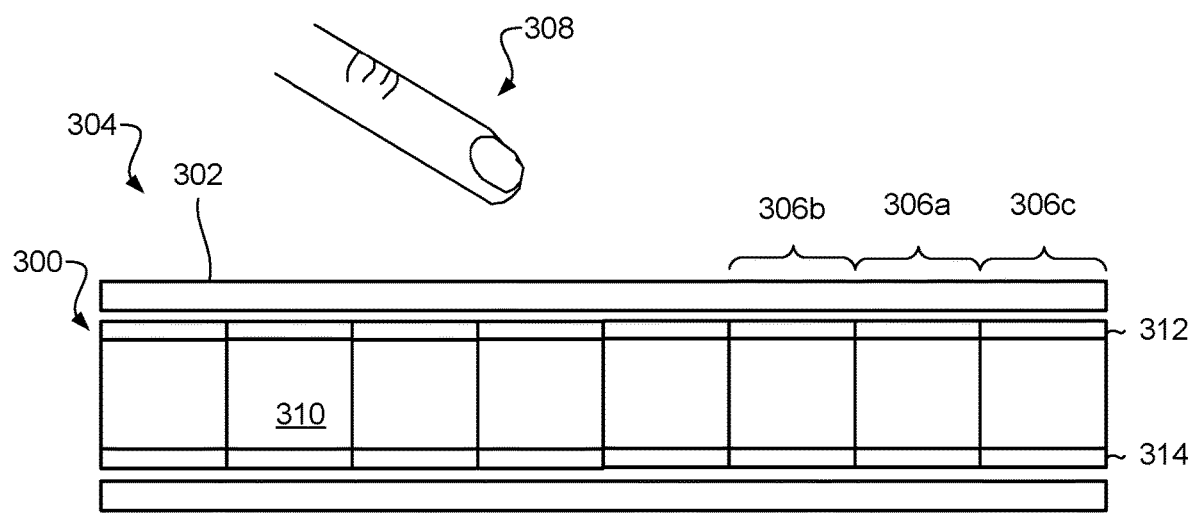
FIG. 3 depicts an example of an input device according to the present disclosure.

FIG. 3 depicts an example of a side view of a plurality of force sensors 300 disposed under a surface 302 of an input device 304. In this example, each of the force sensors 300 is located underneath a key position 306. In situations where a user's finger 308 presses on a key position 306, the input device 304 may detect the presence of the finger 308 pressing on the key position 306 from either the pressure transmitted through the surface 302 of the input device 304 to the active material 310 of the force sensor aligned under the surface 302 or through the measured capacitance between the first electrically conductive material 312 and the second electrically conductive material 314 of the force sensor 300.

In this example, the surface 302 is made of a single continuous material that is not configured to have the key positions independently movable with respect to other key positions. For example, in a situation where a first key position 306a is pressed, the first key position 306a is not configured to move independently of an adjacent key position 306b. In some cases, the surface 302 may flex at the location of key position 306a due to the pressure applied by the finger. In some cases, the size of the area that flexes is limited to be within the key position, but if the pressure applied by the finger is high enough, the size of the area that flexes may be greater than the area contained within the first key position 306a and expand into the areas of the adjacent key positions 306b, 306c. However, in this example, key positions 306a, 306b, and 306c are not configured to move independently of each other.

Figure 4:
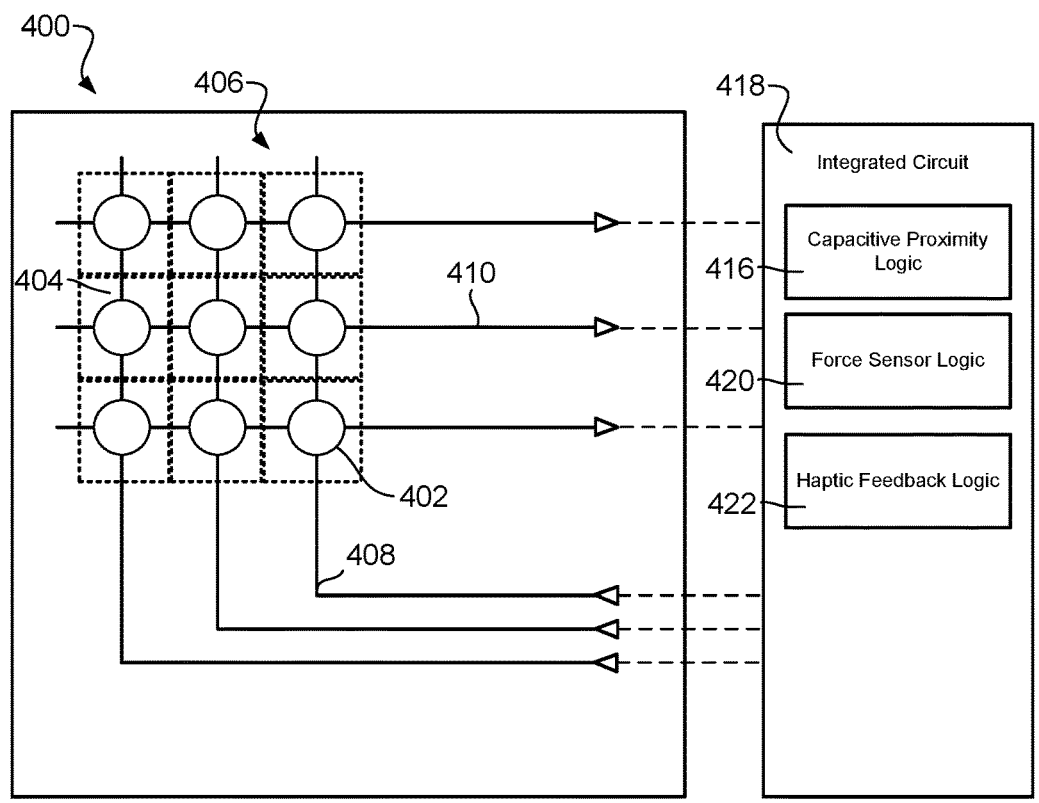
FIG. 4 depicts an example of a grid of transmit lines and sense lines in an input device according to the present disclosure.

FIG. 4 depicts an example of circuitry for the input device 400. In this example, the force sensors 402 are positioned under key positions 404 of the input device 400. A grid 406 of transmit lines 408 and sense lines 410 are integrated in with the force sensors. For example, the transmit lines 408 may be connected to the first electrically conductive material of the force sensor 402, and the sense line may be connected to the second electrically conductive material of the force sensor 402, or vice versa. In the illustrated example, just a representative number of the transmit lines 408 and the sense lines 410 are depicted for simplicity. In this example, each of the transmit lines 408 are connected to sense lines 410 through force sensors 402. The portions of the transmit line 408 and the portions of the sense line 410 in the grid 406 are considered for purposes of this disclosure to be the electrode portion of the transmit lines 408 and the sense lines 410. The portions of the transmit lines 408 and the sense lines 410 that are outside of the grid 406 that send information to the integrated circuit are considered for purposes of this disclosure to be trace or route portions of the transmit lines 408 and the sense lines 410.

A voltage may be applied to each of the transmit lines 408 individually based on a predetermined sequence. In some cases, the sequence may cycle through each of the transmit lines 408 in a specific order and allow each of the transmit lines 408 to be energized individually at different times. In other examples, each of the transmit lines 408 may have a voltage continuously applied.

Capacitive proximity logic 416 of an integrated circuit 418 in communication with the traces of the transmit lines 408 and the sense lines 410 may interpret the voltage changes caused by a user pressing on the key positions, by a gesture input over the key positions, or by both. This information may be sent to an operating system that is running a program on the computing device.

In examples where the computing device also includes a touch pad, the capacitive proximity logic 416 of the same integrated circuit 418 may receive inputs from the touch pad.

The information from the touch pad may be used to determine information about the location of the cursor, selection of objects in the computing device's display, or other types of information. This information may also be sent from the integrated circuit 418 to the operating system to provide additional instructions to the program being operated by the computing device.

The integrated circuit 418 may process the voltage inputs from the input device about the capacitance measurements at the key positions 404 and the capacitance measurements from the touch pad simultaneously. Processed information from the integrated circuit 418 relating to the key positions and the touch pad may be sent simultaneously to the operating system. In some cases, the information received from either the key positions or the touch pad is processed and sent in real time without interference from each other.

One advantage to processing the touch pad and key position inputs on the same integrated circuit is that inconsistencies between the key positions and the touch pad inputs can be addressed at the integrated circuit level rather than sending the inconsistent signals to the operating system before the inconsistencies are addressed. For example, in certain instances where the palm of the user's hand is resting on the touch pad while the user is typing may result in inputs from the touch pad and the key positions at the same time which may appear inconsistent. In some cases, the integrated circuit 418 may run a process that results in rejecting the inputs from the touch pad and sends only the inputs associated with the key positions to the operating system. This prevents incorrect information from being sent through multiple processing levels. Thus, bandwidth and processing resources are used more efficiently.

In some examples, the integrated circuit 418 is in communication with both the key positions and a touch pad. Additionally, in this example, force sensor logic 420 may be used to process inputs from the force sensors 402, which may contribute information to determine whether the user is pressing on a key position. Further, in this example, the integrated circuit 418 includes haptic feedback logic 422, which can cause haptic feedback signals to be delivered to the force sensors 402. In some examples, having the haptic feedback logic integrated into a circuit with the capacitive proximity logic 416 allows for faster haptic feedback responses with less errors. Alternatively, an independent circuit can provide logic associated with the force sensors 402 and the haptic feedback.

Figure 5:
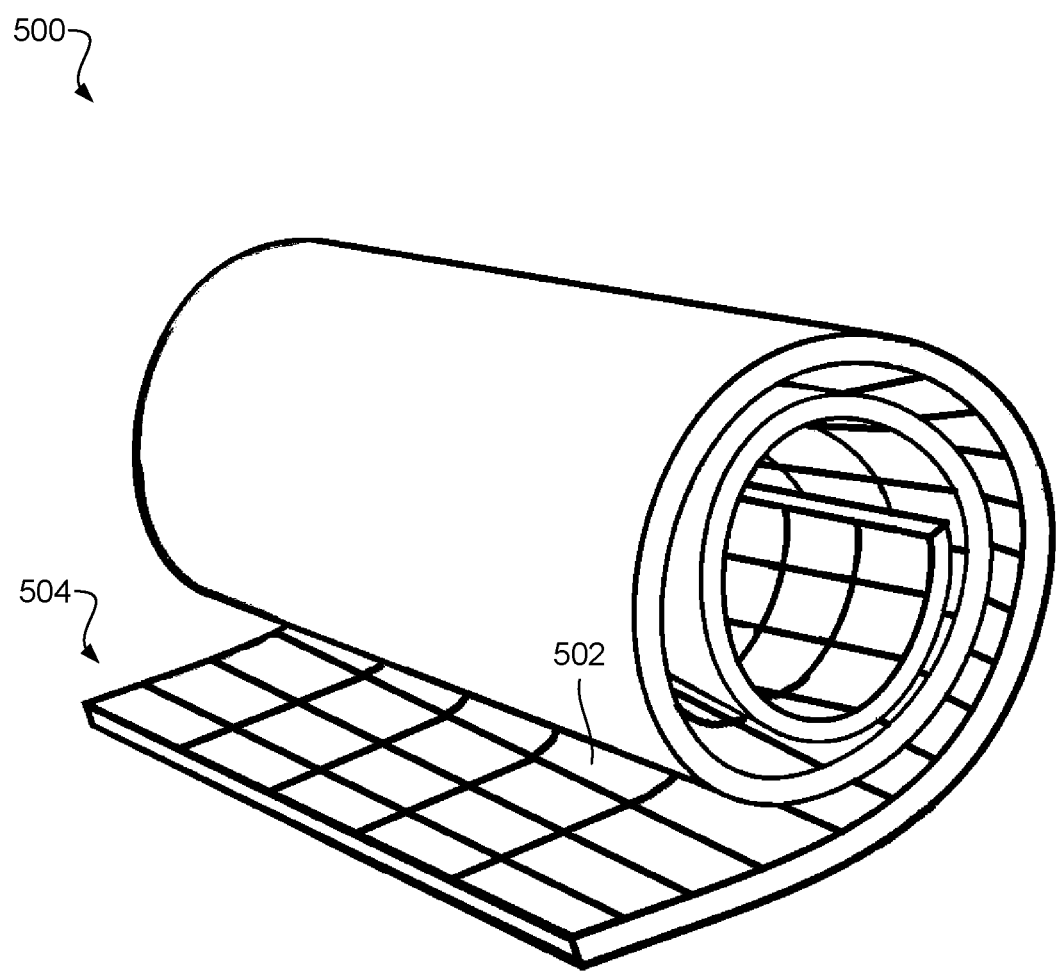
FIG. 5 depicts an example of a flexible input device according to the present disclosure.

FIG. 5 depicts an example of an input device 500 with multiple key positions 502 disposed on the surface 504 of the input device. The material of the surface 504 and other components of the input device 500 may be made of a flexible material, which allows the input device 500 to have flexibility. This flexibility may allow the input device 500 to be rolled up, folded, twisted, or otherwise manipulated. Such flexibility may allow the input device 500 to be used on an uneven surface. In other examples, the flexible input device 500 may be made smaller through folding or rolling for convenience when carrying the input device 500.

Figure 6:
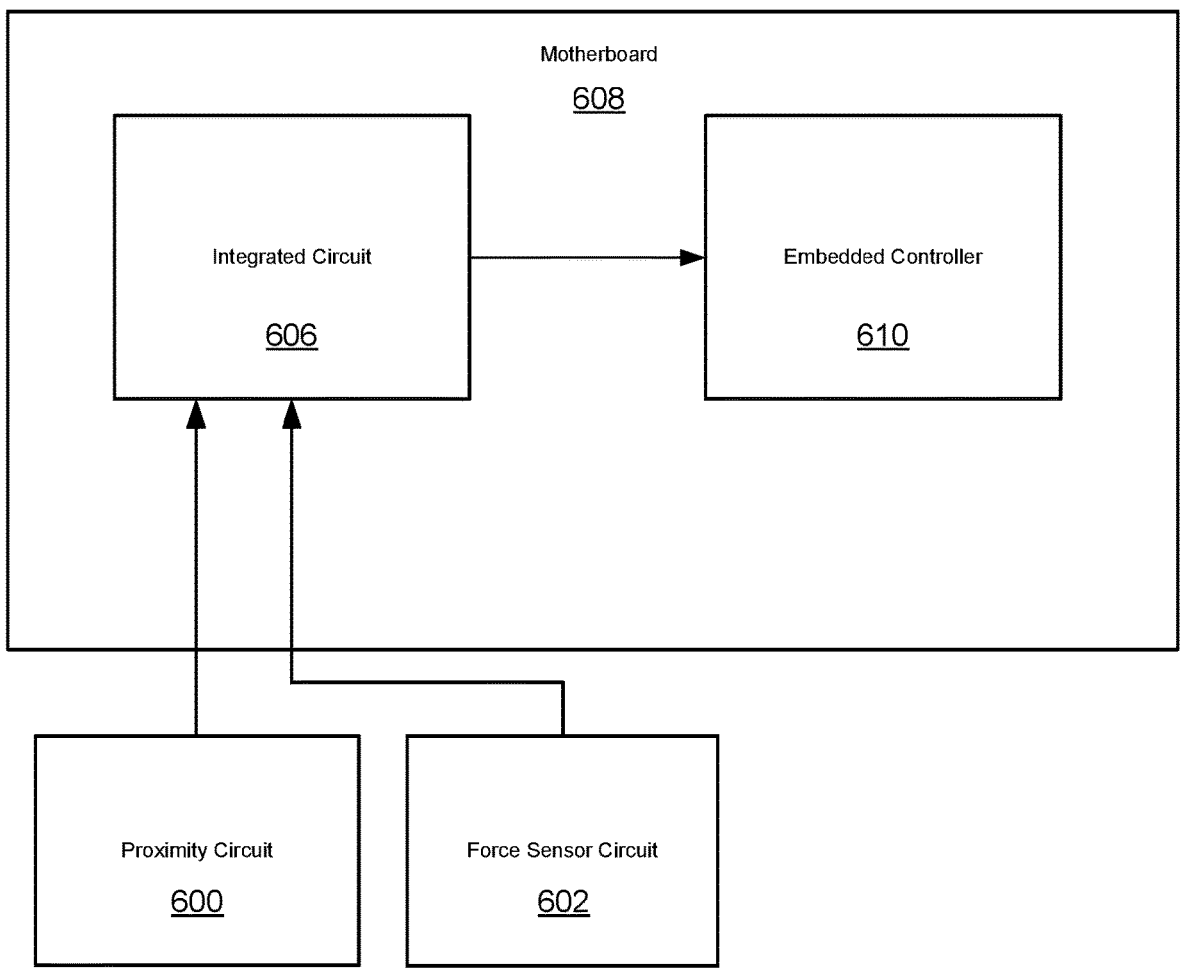
FIG. 6 depicts an example of a proximity circuit and a force sensor circuit in communication with an integrated circuit according to the present disclosure.

FIG. 6 depicts an example of components of a computing device with an integrated or peripheral input device. In this example, a proximity circuit 600, which may be based on the principles disclosed in FIGS. 2-4, and a force pad circuit 602 are in communication with an integrated circuit 604. In some examples, the integrated circuit 606 may be located on a motherboard 608 of the computing system.

The motherboard 608 may provide additional layers of processing for the components of the computing system. The motherboard may include a printed circuit board (PCB) and multiple control circuits, memory, and processing units on the PCB. The motherboard may provide a processing layer where the control circuits interact with each other. Additionally, the PCB of the motherboard 608 may include connectors where peripheral devices can be plugged in. The motherboard 608 may include traces that connect different control circuits together. In some computing systems, the motherboard 608 may include an embedded controller 610 that may provide at least some processing resources to specific controller circuits. In this example, the integrated circuit provides information to the embedded controller 610. Another advantage to the principles described in the present disclosure is that real estate on the motherboard is minimized by having a single integrated circuit 608 on the motherboard 608 that handles the processing of the touch pad and the keyboard rather than having a separate integrated circuit for each of the keyboard and the touch pad.

The logic that processes the capacitive proximity inputs and the logic that processes the force sensors can share common components by being part of the same circuit, thereby simplifying the circuitry of the computing device and reducing parts. At least one of the common components that these sets of logic may share include transmit pins, receive pins, memory, processing resources, communication pins, regulators, other components, or combinations thereof.

FIG. 7 depicts an example of another type of input device 700 that may be integrated into a computing device 702 that may be suitable with the present disclosure. In this example, the input device 700 does not have a track pad like the example depicted in FIG. 1.

FIG. 8 depicts an example of a peripheral input device 800 that can be connected through a cable 802 to a display 804 of a computing device 802. In some examples, the peripheral input device 800 may be wirelessly connected to the computing device 800 and/or display 804. In the examples depicted in FIGS. 7 and 8, the key positions 806 may be visible to the user based on decals, sticks, icons, images, symbols, protrusions, recesses, or other types of indicia identifying the location of the key positions.

FIG. 9 depicts a mobile computing device 900, such as a phone, electronic tablet, digital assistant, or another type of mobile device. In this example, the key positions may appear digitally at times on the screen depending on the operations of the mobile computing device. In these examples, a force sensor may be individually located under where each of the key positions appear on the screen.

Figure 10:
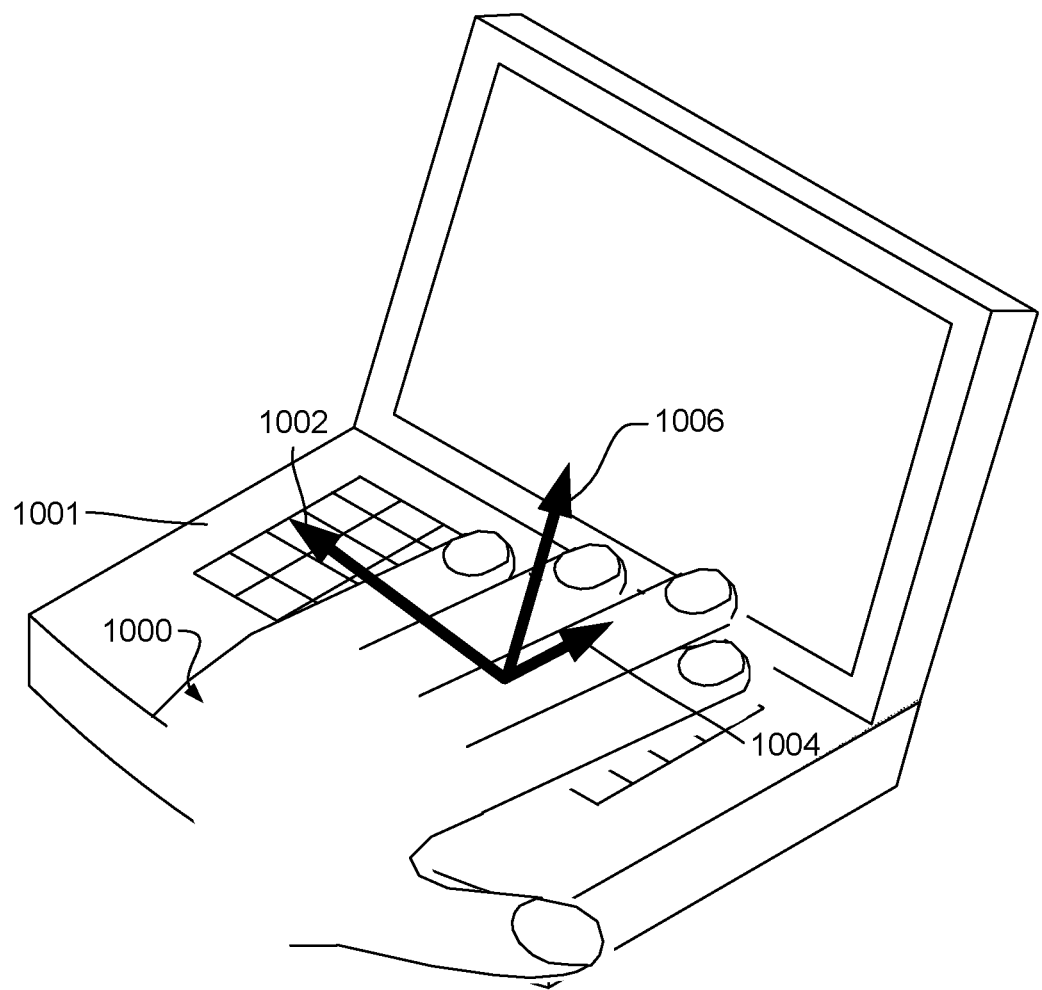
FIG. 10 depicts an example of hand gesture over an input device according to the present disclosure.

FIG. 10 depicts an example where a hand gesture 1000 is performed over an input device 1001 in accordance with the principles described herein. The capacitive proximity logic connected to the input device's electrodes enables the detection of hand gestures over the input device 1001.

Any appropriate type of hand gesture 1000 may be detectable over the input device 1001. The hand gesture 1000 may be recognized through a motion over the input device 1001 based, at least in part, on movement along a direction 1002 aligned with the length of the input device 1001, a direction 1004 aligned with the width of the input device 1001, a vertical direction 1006 in relation to the input device 1001, a direction diagonal to the input device 1001, another direction, another type of movement, or combinations thereof. In some cases, the hand gesture may include a U-shaped movement, a circular movement, an angled movement, an L-shaped movement, a spiral movement, a diagonal movement, a vertical movement, a lateral movement, a zig zagged movement, a continuous movement, a tapping movement, a waving movement, a discontinuous movement, a pinching movement, an asymmetric movement, a clapping movement, another type of movement, or combinations thereof. The hand gesture 1000 may be performed with a single hand, two hands, multiple hands, or combinations thereof.

In some cases, the hand gesture 1000 is detectable when the gesture is performed close to the key positions of the input device 1001. In other examples, the hand gesture may be detectable when the gesture is positioned within a three dimensional space defined by the length of the input device 1001, the width of the input device 1001, and the height of the computing device's display.

In some cases, the two-dimensional location of the hand gesture 1000 may determine the type of action that is to be executed. For example, a hand gesture 1000 performed over the right side of the input device 1001 may trigger a different action than if that hand gesture was performed over the left side or the middle side of the input device 1001.

In some cases, the three-dimensional location of the hand gesture 1000 may determine the type of action that is to be executed. For example, a hand gesture 1000 performed within millimeters over the input device 1001 may trigger a different action than if that hand gesture 1000 was performed at an elevation of approximately half of the height of the display or even at an elevation of approximately the entire height of the display.

The hand gesture 1000 may be used to execute any appropriate type of action in the computing device. For example, the hand gesture may be used to execute at least one of the actions from the following non-exhaustive list, but not limited to changing a power mode, turning a computer on/off, initiating a sleep mode, reducing the number of processes being operated on the computer, initiating a power savings mode, increasing the performance of the computing device, sending instructions to a program being operated by the computing system, opening/closing programs, saving documents, printing documents, sending an email, drafting text, creating a picture, copying and pasting functions, changing a display setting, changing an audio setting, activating a backlight system, deactivating a backlight system, moving a cursor, selecting an object in the display, other types of actions, or combinations thereof.

Figure 11:
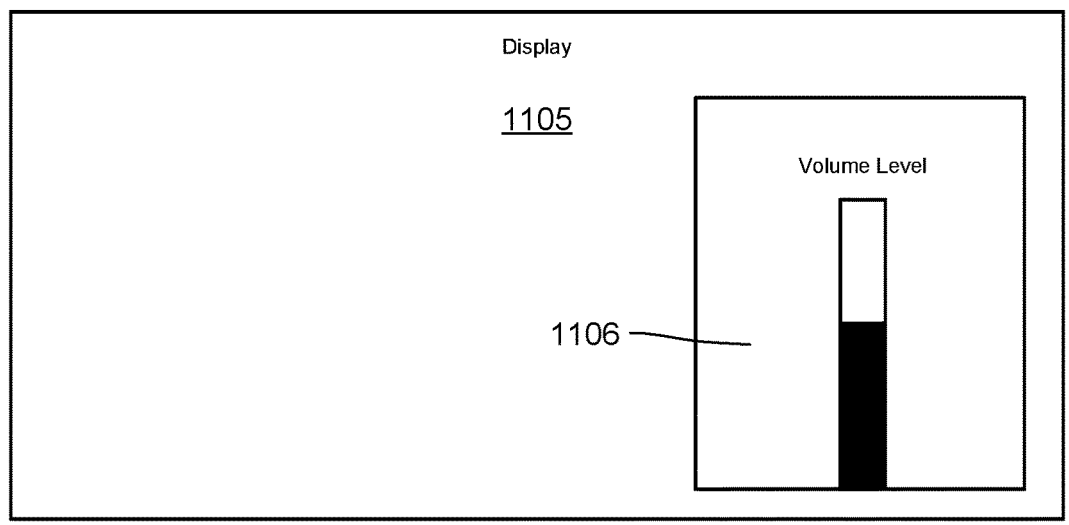
FIG. 11 depicts an example of hand gesture triggering an action over an input device according to the present disclosure.
Figure 11:
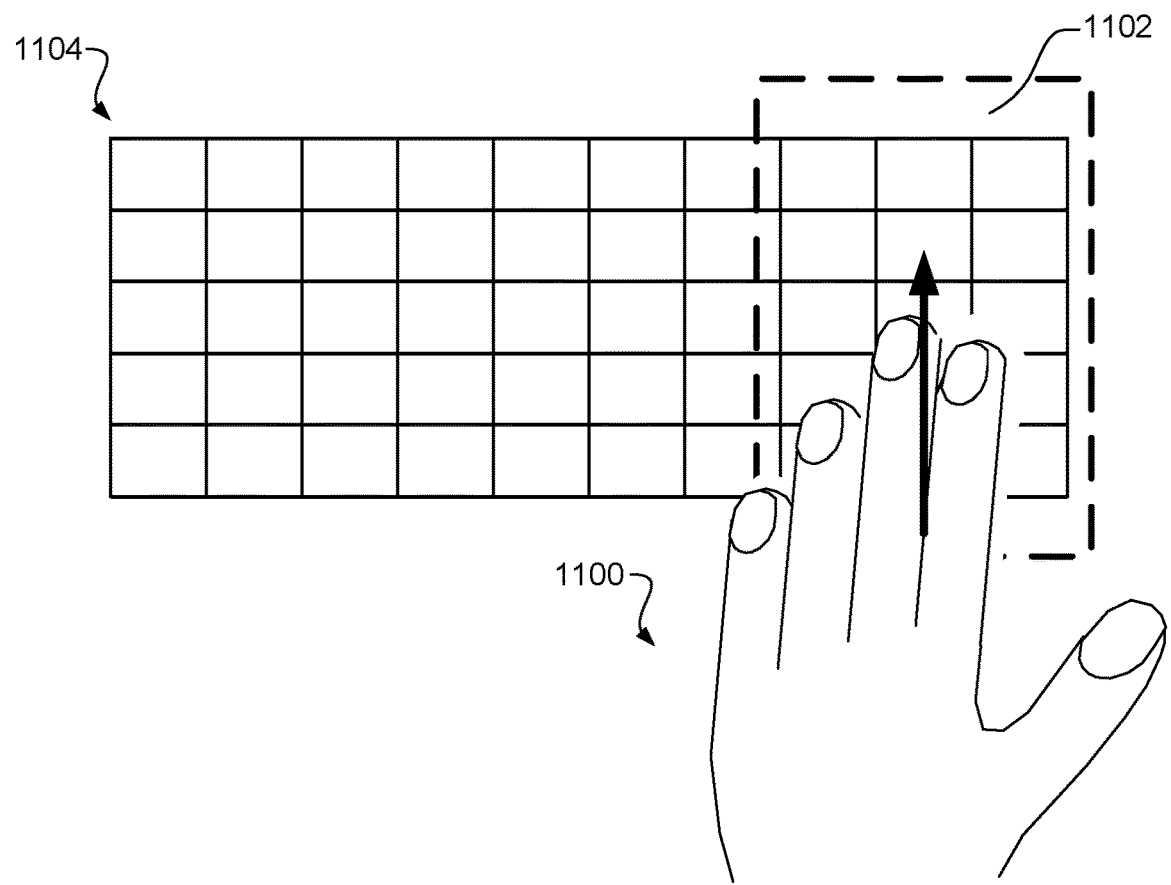

FIG. 11 depicts an example of a hand gesture 1100 over a first area 1102 located on a right hand side of the input device 1104. In this example, the hand gesture 1100 triggers a presentation of an audio level indicator 1106 in the display 1105. In response to displaying the volume level indicator 1106, the user may raise or lower his or her hand to raise or lower the audio level accordingly. In some cases, the user may move his or her hand away to close the volume level indicator 1106.

Figure 12:
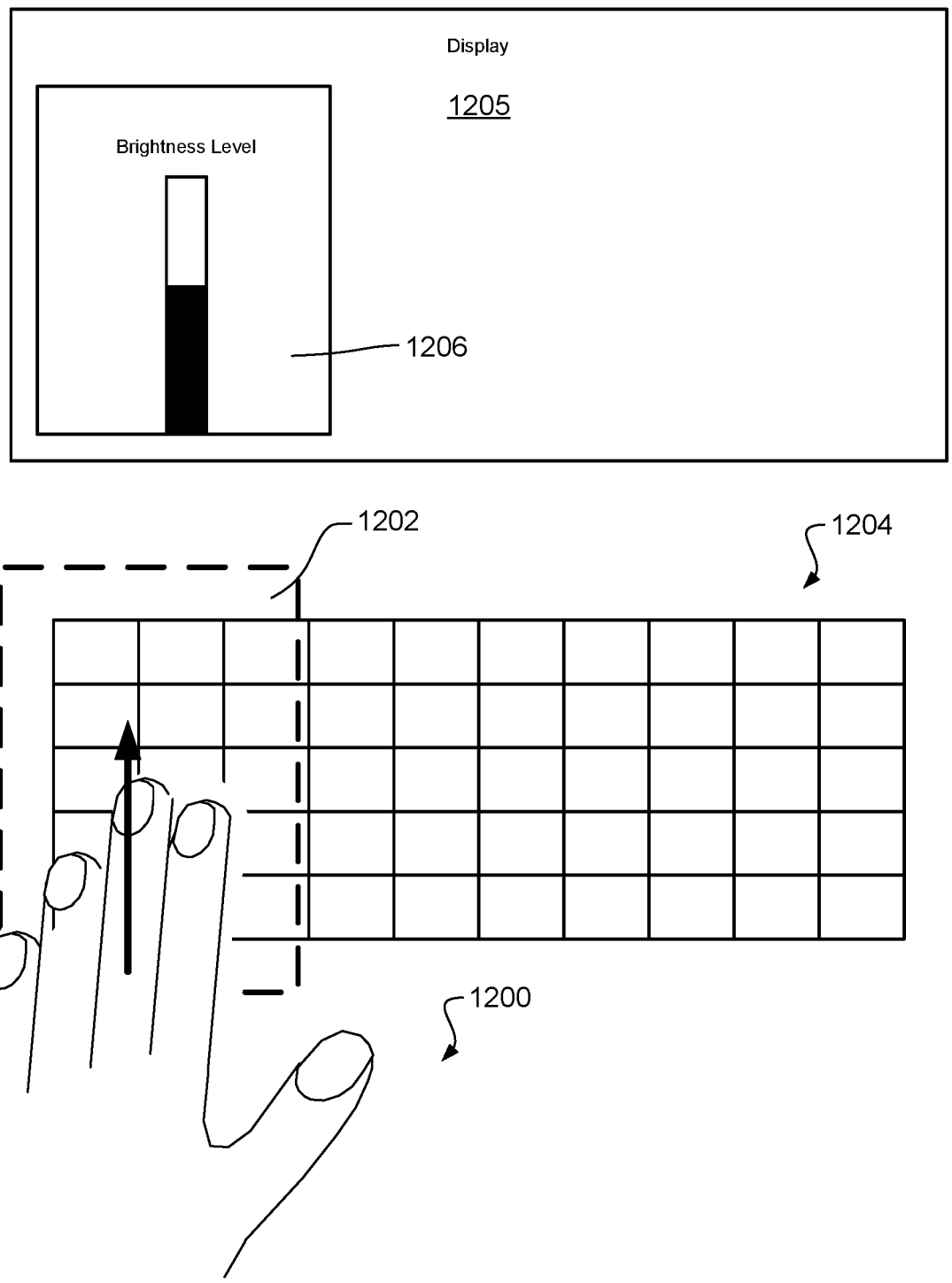
FIG. 12 depicts an example of hand gesture triggering an action over an input device according to the present disclosure.

FIG. 12 depicts an example of a hand gesture 1200 over a second area 1202 located on a left hand side of the input device 1204. In this example, the hand gesture 1200 triggers a presentation of a screen brightness indicator 1206 in the display 1205. In response to displaying the screen brightness indicator 1206, the user may raise or lower his or her hand to brighten or dim the screen brightness accordingly. In some cases, the user may back his or her hand out to close the screen brightness indicator 1206.

Figure 13:
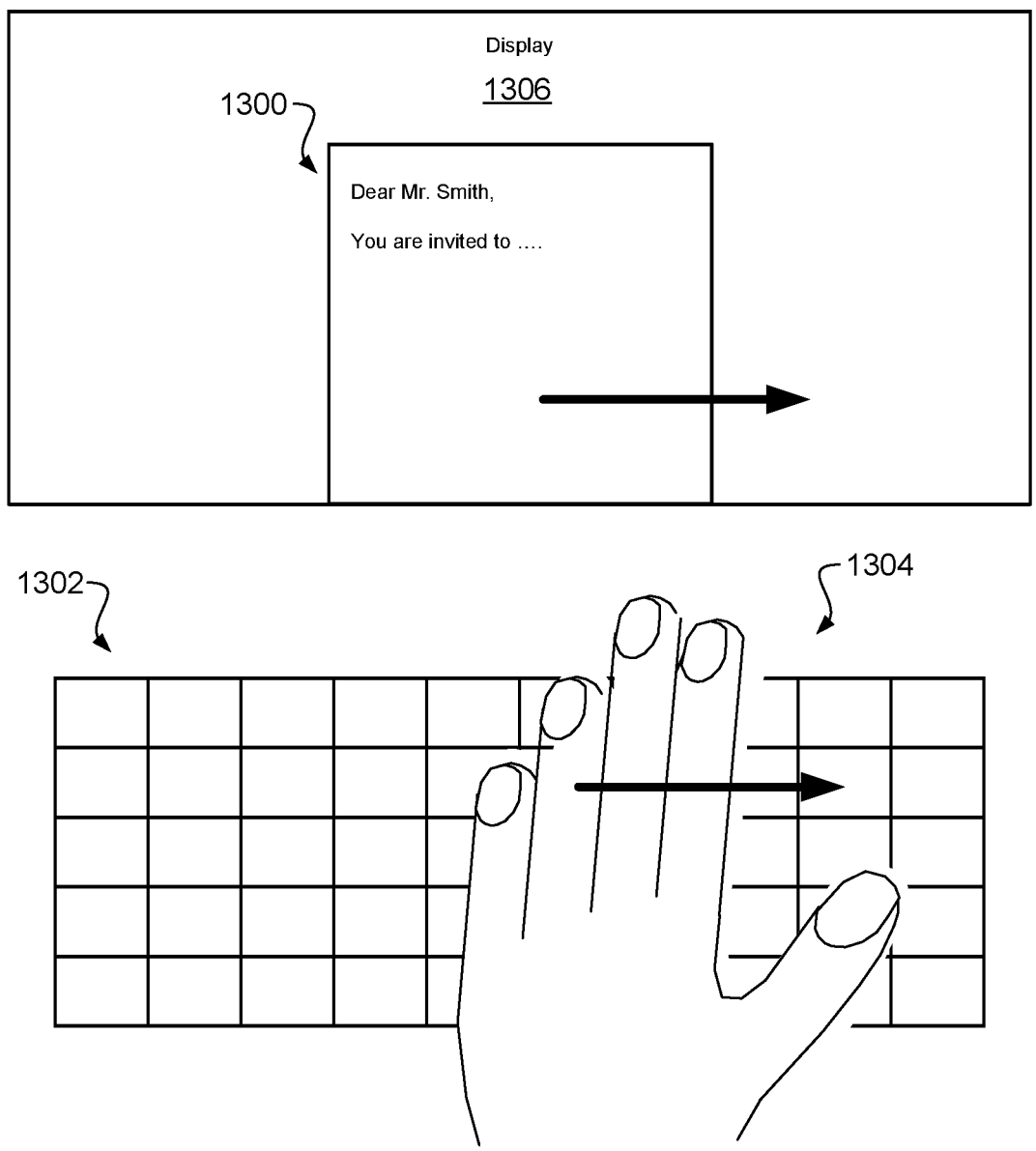
FIG. 13 depicts an example of hand gesture triggering an action over an input device according to the present disclosure.

FIG. 13 depicts an example of a user swiping his or her hand along at least a portion of the length of the input device 1302. In this example, this hand gesture 1304 may cause an open document 1300 in the display 1306 to be moved to the side, minimized, closed, saved, otherwise controlled, otherwise affected, or combinations thereof. In some cases, the user may cause the opposite action by moving his or her hand back in the opposite direction. For example, if swiping a hand to the right causes the document 1300 to close, swiping the hand to the left may cause the document 1300 to open.

Figure 14:
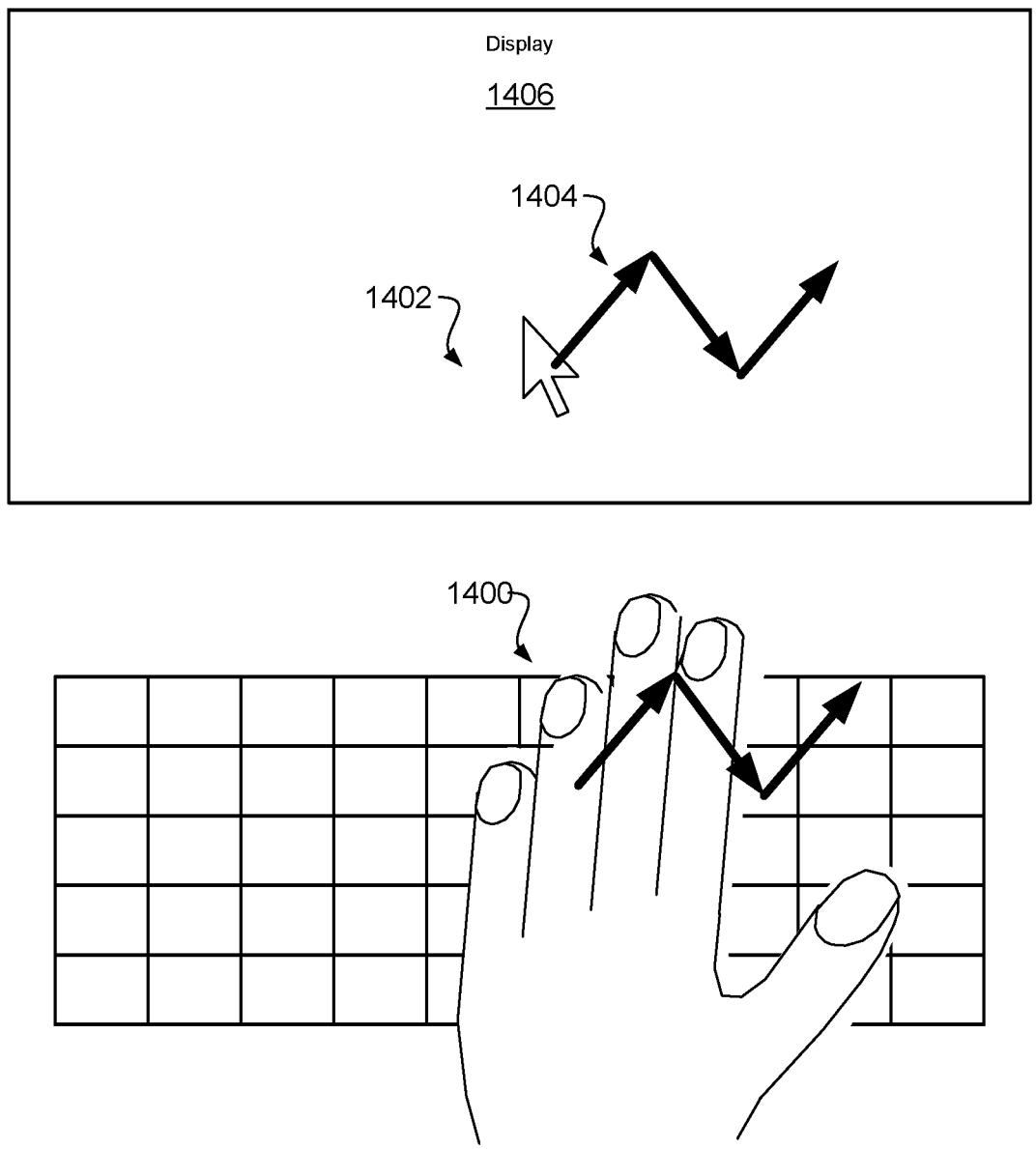
FIG. 14 depicts an example of hand gesture triggering an action over an input device according to the present disclosure.

FIG. 14 depicts an example of a hand gesture 1400 triggering an action of moving a cursor 1402 in the display 1406. In this example, the user moves his or her hand in a zag zagged movement 1404, and the cursor 1404 follows by moving in a zag zagged movement 1404.

Figure 15:
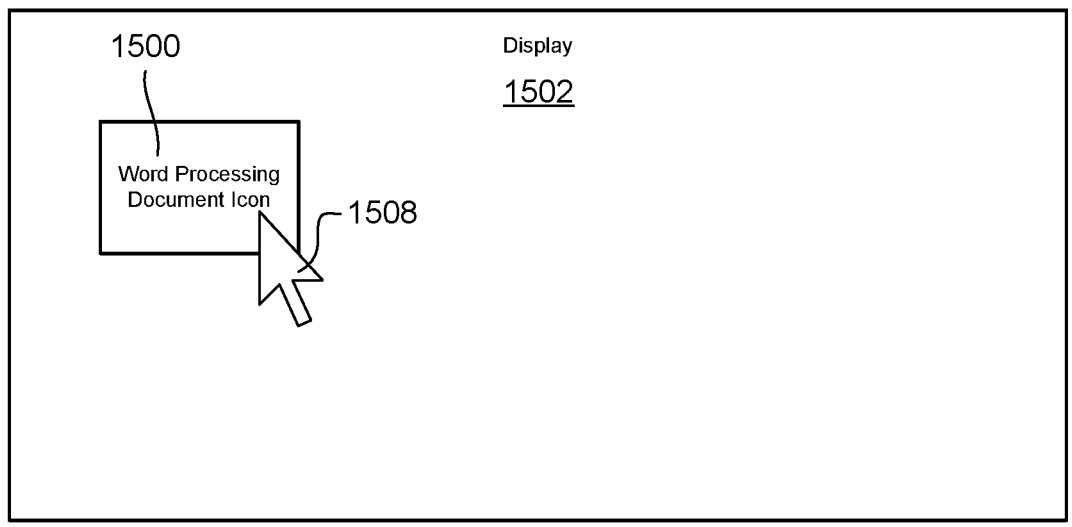
FIG. 15 depicts an example of hand gesture triggering an action over an input device according to the present disclosure.
Figure 15:
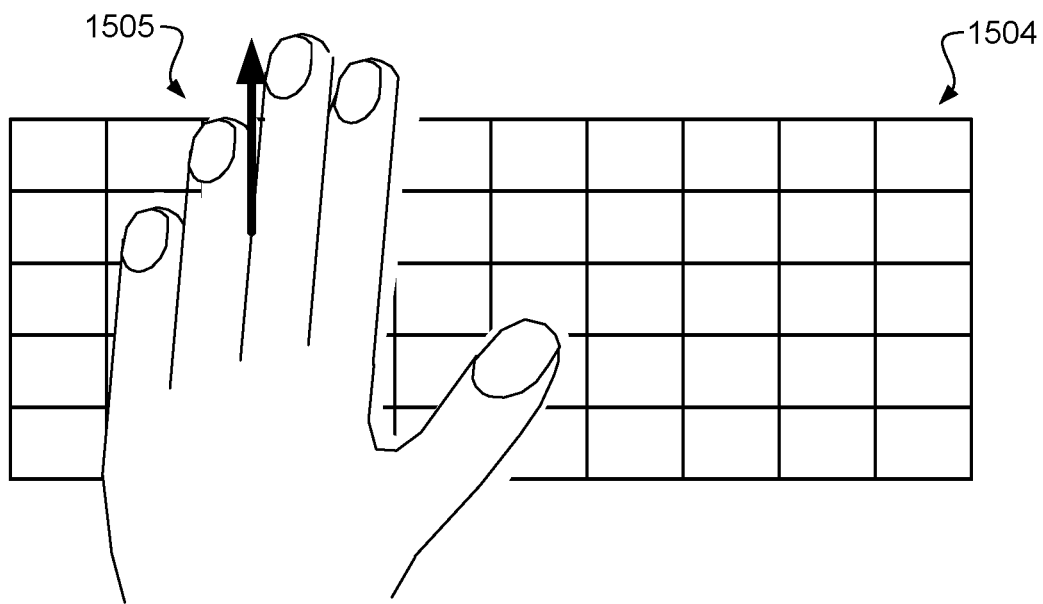

FIG. 15 depicts an example of selecting an object 1500 in a display 1502 of the computing device with a hand gesture 1505 performed over the input device 1504. In this example, the user may perform a first hand gesture that locks the movement of the cursor 1508 to the user's hand movement. Then the user may cause the cursor 1508 to move to the object 1500 by performing a second gesture. Then the user may perform a third gesture to select the object 1500. In some examples, the object 1500 is a program icon and selecting the object 1500 may cause the program to open or otherwise perform a task. After selecting the object 1500, the user may continue to move the cursor 1508 with a fourth gesture. When desired, the user may perform a fifth gesture to cause the cursor to unlock from the user's hand movement. In some examples, the gestures mentioned above or other gestures may be identified by the same movement, different movements, the same locations, different locations, or combinations thereof.

Figure 16:
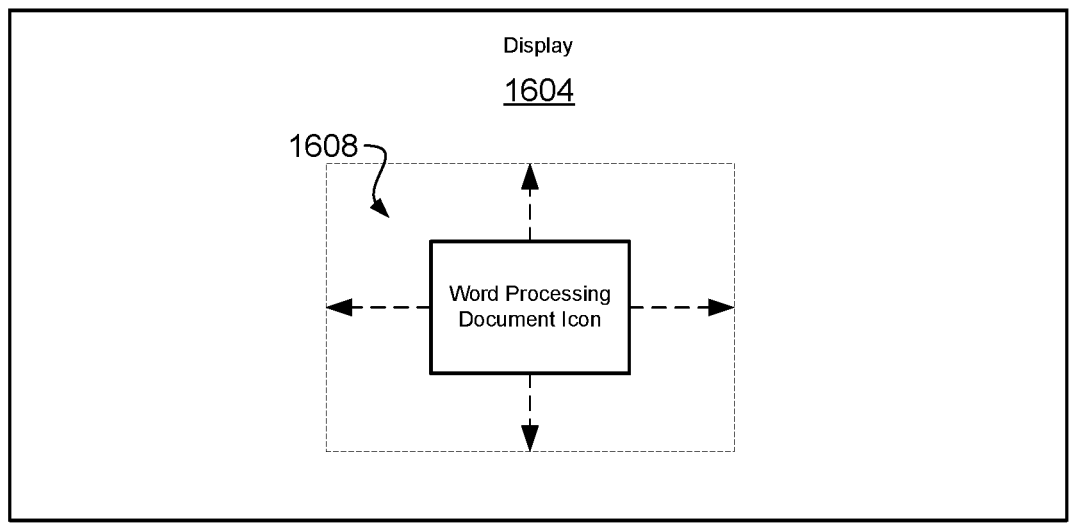
FIG. 16 depicts an example of hand gesture triggering an action over an input device according to the present disclosure.
Figure 16:
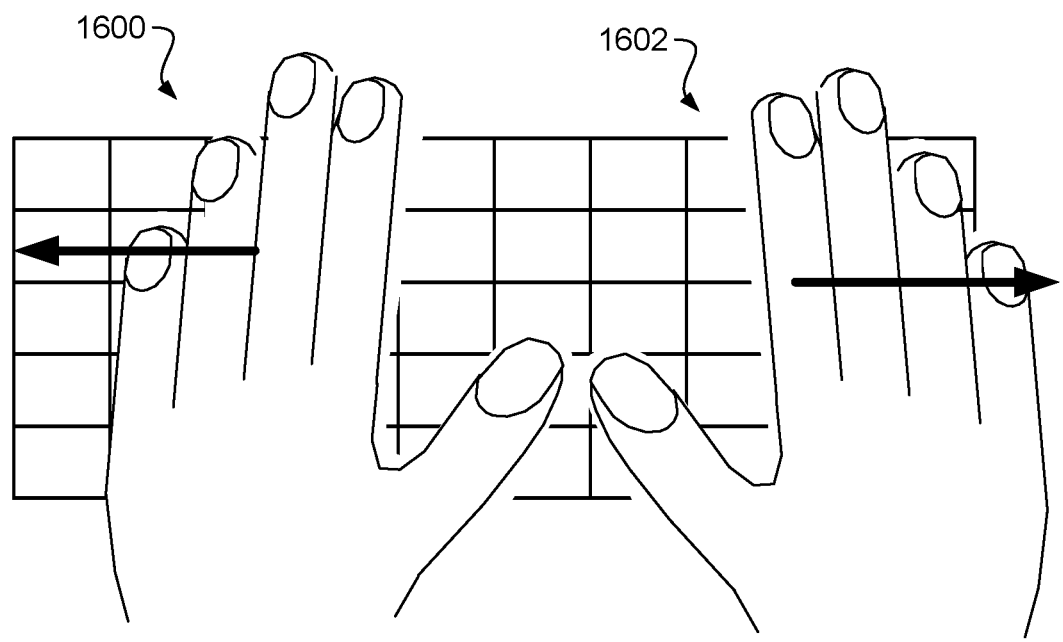

FIG. 16 depicts an example of using a first hand 1600 and a second hand 1602 to perform a gesture. In the example illustrated in FIG. 16, the first and second hands 1600, 1602 are moving apart and causing an object 1608 in the display 1604 to expand. In other examples, the first and second hands 1600, 1602 may move closer together to cause the object to shrink.

Figure 17:
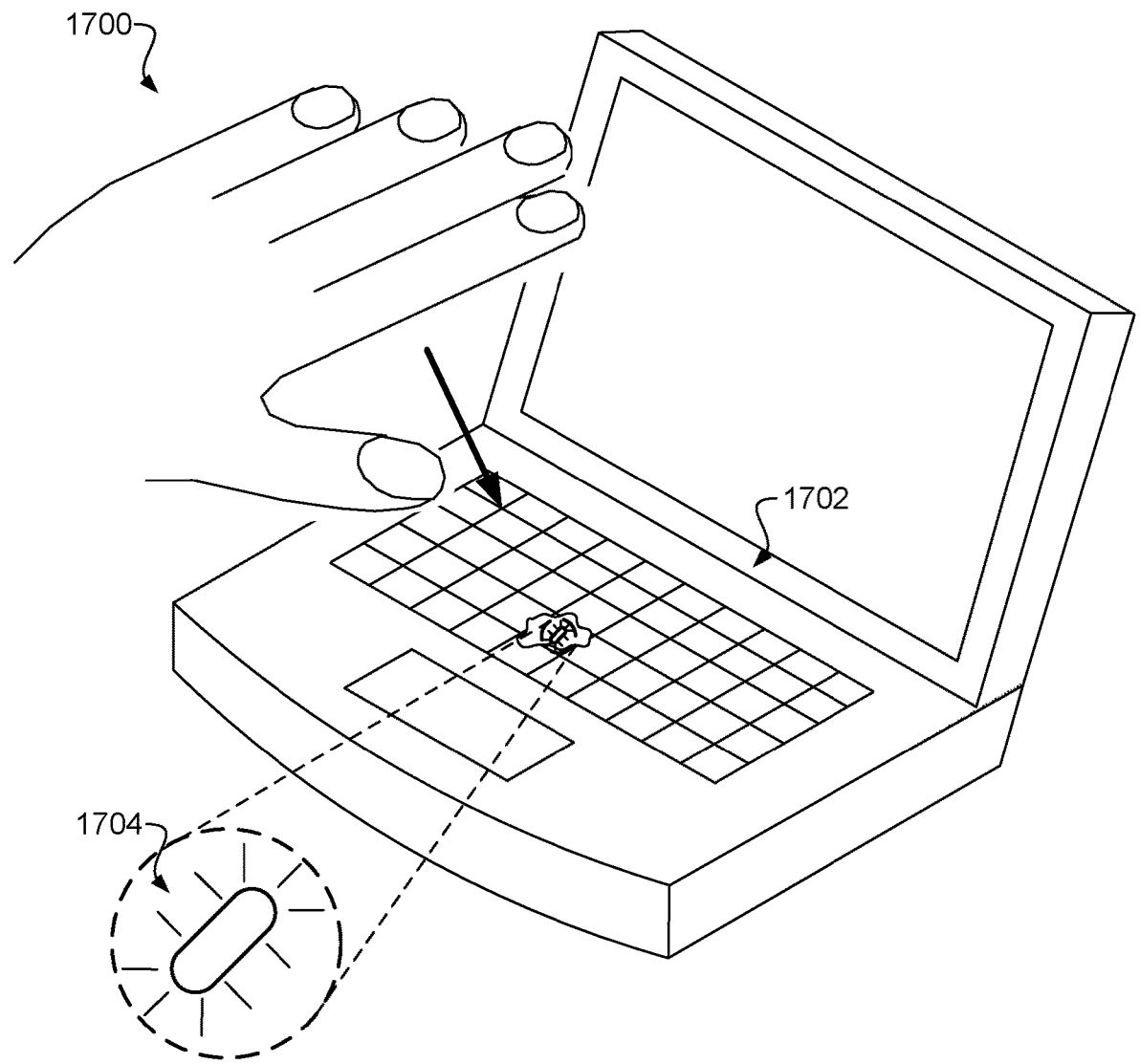
FIG. 17 depicts an example of hand gesture triggering an action over an input device according to the present disclosure.

FIG. 17 depicts an example of a hand gesture of a hand 1700 approaching the input device 1702. In response to this gesture, the triggered action may be energizing at least one backlight associated with the input device 1702. In this example, an LED 1704 incorporated into the input device 1702 may be activated. In some cases, the backlight may remain on as long as any movement is detected through either the proximity sensing features of the input device 1702. After a predetermined time period of no movement, the backlight may turn off.

Figure 18:
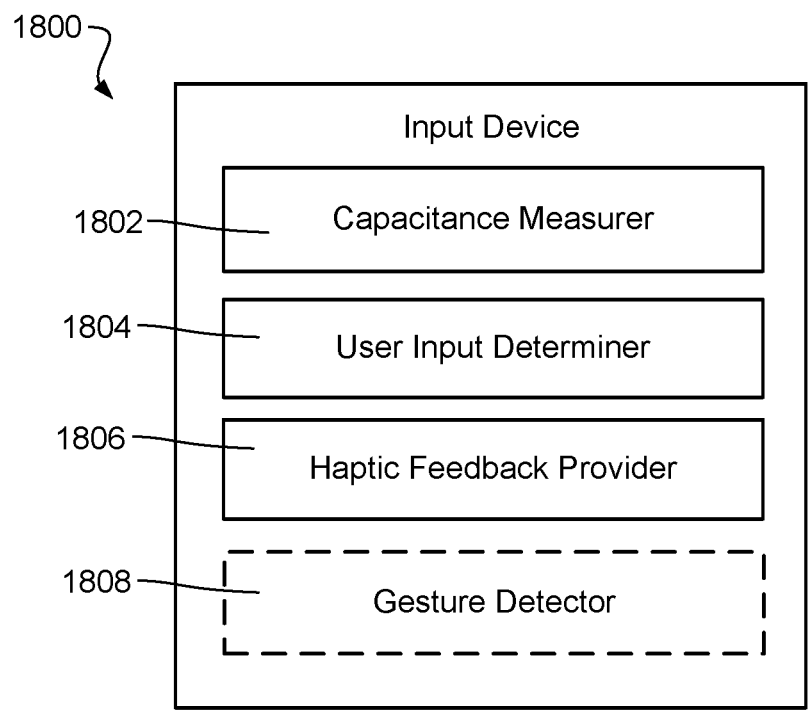
FIG. 18 depicts an example of an input device according to the present disclosure.

FIG. 18 depicts an example of an input device 1800. In this example, the input device 1800 includes programmed instructions in memory and may include associated firmware, logic, processing resources, memory resources, power sources, processing resources, hardware, or other types of hardware to carry out the tasks of the input device 1800. The input device 1800 includes a capacitance measurer 1802, a user input determiner 1804, and a haptic feedback provider 1806. In some examples, the input device may optionally include a gesture detector 1808.

The capacitance measurer 1802 may measure the capacitance in the input device. For example, the capacitance measurer 1802 may measure the capacitance between portions of a force sensor incorporated into the input device. In some examples, the force sensor may include the active material with a first electrical conductive material on a first side of the active material and a second electrically conductive material on a second side of the active material. As a finger from a user or another type of object approaches the key position above the force sensor, the finger or other type of object can cause the capacitance between the first and second electrically conductive materials to change. This difference in capacitance can be detected.

In other examples, the input device may include a circuit for measuring capacitance that is independent of the circuits involved with the force sensors. In such an example, the capacitance sensors may be used to detect hand gestures or when the user presses on a key position. In other examples, the capacitance circuit may be used to just detect hand gestures. In some cases, the force sensors may be used to just provide haptic feedback. In yet another example, the force sensor may be used to provide the haptic feedback sensor and detect when a user is pressing on the force sensor.

The user input determiner 1804 may be used to determine when a user is making an input to the user input device. The user input may be determined by calculating the difference in capacitance.

The haptic feedback provider 1806 may send a signal to the active material of the force sensor that causes the active material to vibrate or otherwise move. When the user's finger or other object is on the key position of the input device, the movement of the active material may be felt by the user. The haptic feedback may provide an indication to the user that the input has been received by the input device.

In those examples that include a gesture detector 1808, the capacitance changes in the force sensor or in a dedicated capacitance circuit may be detected that indicate a hand gesture above the input device. The capacitance signature caused by a hand gesture may be different from the capacitance signature caused by pressing on the key position. Thus, an input of pressing on the key position and an input of performing a hand gesture above the input device may be distinguishable.

Figure 19:
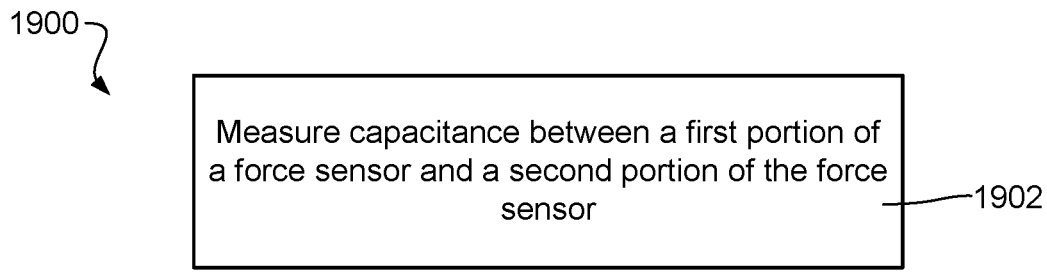
FIG. 19 depicts an example of measuring capacitance according to the present disclosure.

FIG. 19 depicts an example of a method 1900 of measuring capacitance according to the present disclosure. This method 1900 may be performed based on the description of the devices, module, and principles described in relation to FIGS. 1-18. In this example, the method 1900 includes measuring 1902 capacitance between a first portion of a force sensor and a second portion of the force sensor.

Figure 20:
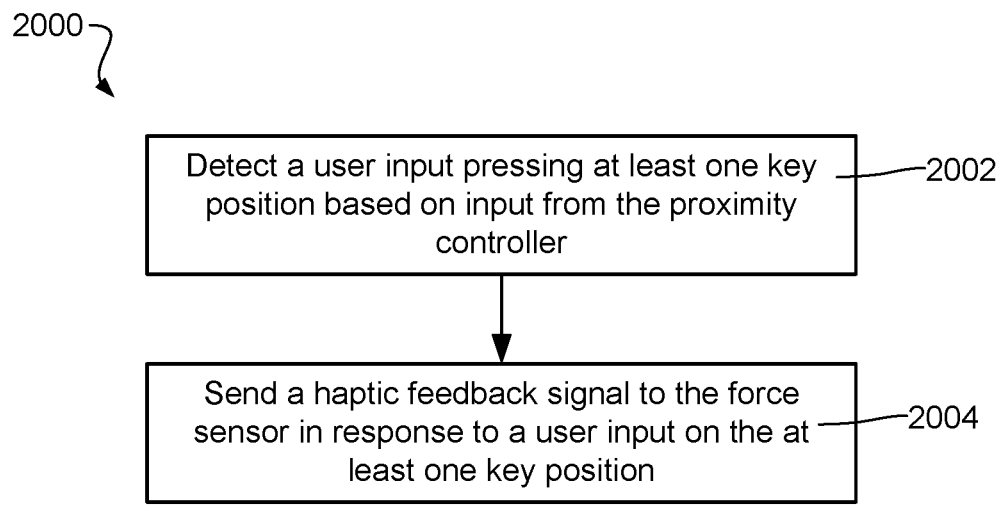
FIG. 20 depicts an example of sending a haptic feedback signal according to the present disclosure.

FIG. 20 depicts an example of a method 2000 of detecting a user input according to the present disclosure. This method 2000 may be performed based on the description of the devices, module, and principles described in relation to FIGS. 1-18. In this example, the method 2000 includes detecting 2002 a user input pressing at least one key position based on input from the proximity controller, and sending 2004 a haptic feedback signal to the force sensor in response to a user input on the at least one key position.

Figure 21:
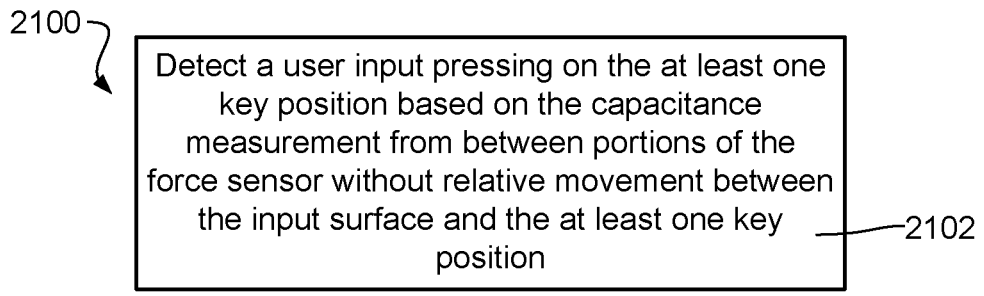
FIG. 21 depicts an example of detecting a user input according to the present disclosure.

FIG. 21 depicts an example of a method 2100 of detecting a user input according to the present disclosure. This method 2100 may be performed based on the description of the devices, module, and principles described in relation to FIGS. 1-18. In this example, the method 2100 includes detecting 2100 a user input pressing on the at least one key position based on the capacitance measurement from between portions of the force sensor without relative movement between the input surface and the at least one key position.

Figure 22:
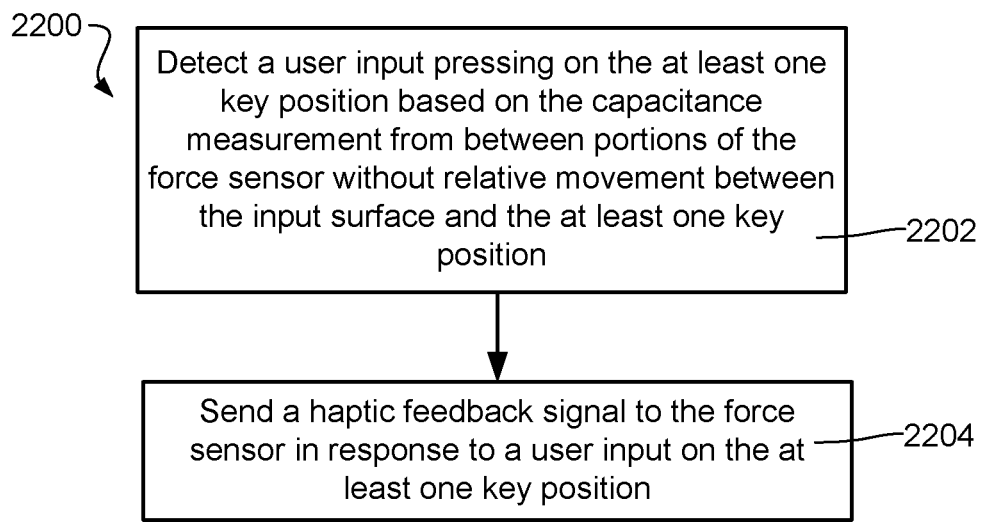
FIG. 22 depicts an example of detecting a user input according to the present disclosure.

FIG. 22 depicts an example of a method 2200 of detecting a user input according to the present disclosure. This method 2200 may be performed based on the description of the devices, module, and principles described in relation to FIGS. 1-18. In this example, the method 2200 includes detecting 2202 a user input pressing on the at least one key position based on the capacitance measurement from between portions of the force sensor without relative movement between the input surface and the at least one key position, and sending 2204 a haptic feedback signal to the force sensor in response to a user input on the at least one key position.

Figure 23:
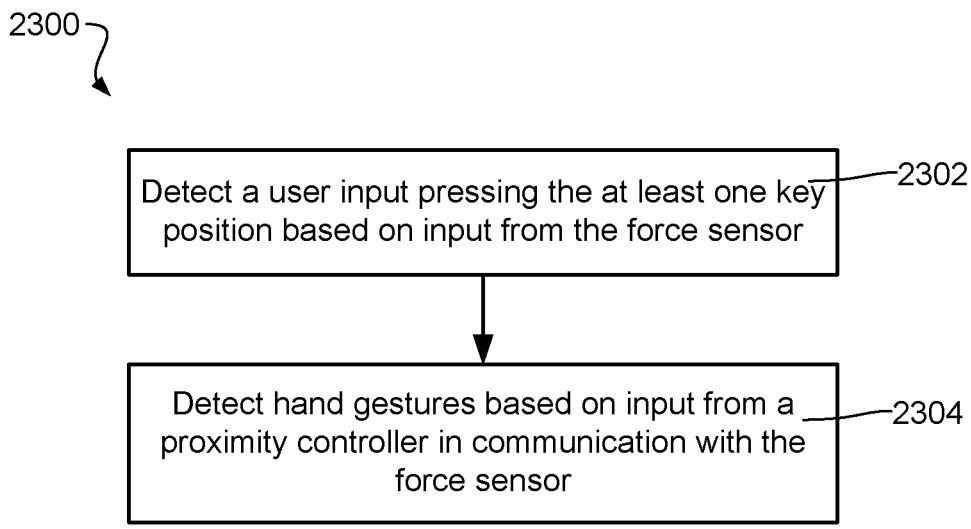
FIG. 23 depicts an example of detecting a user input according to the present disclosure.

FIG. 23 depicts an example of a method 2300 of detecting a user input according to the present disclosure. This method 2300 may be performed based on the description of the devices, module, and principles described in relation to FIGS. 1-18. In this example, the method 2300 includes detecting 2302 a user input pressing that at least one key position based on input from the force sensor, and detecting 2304 hand gestures based on input from a proximity controller in communication with the force sensor.

Figure 24:
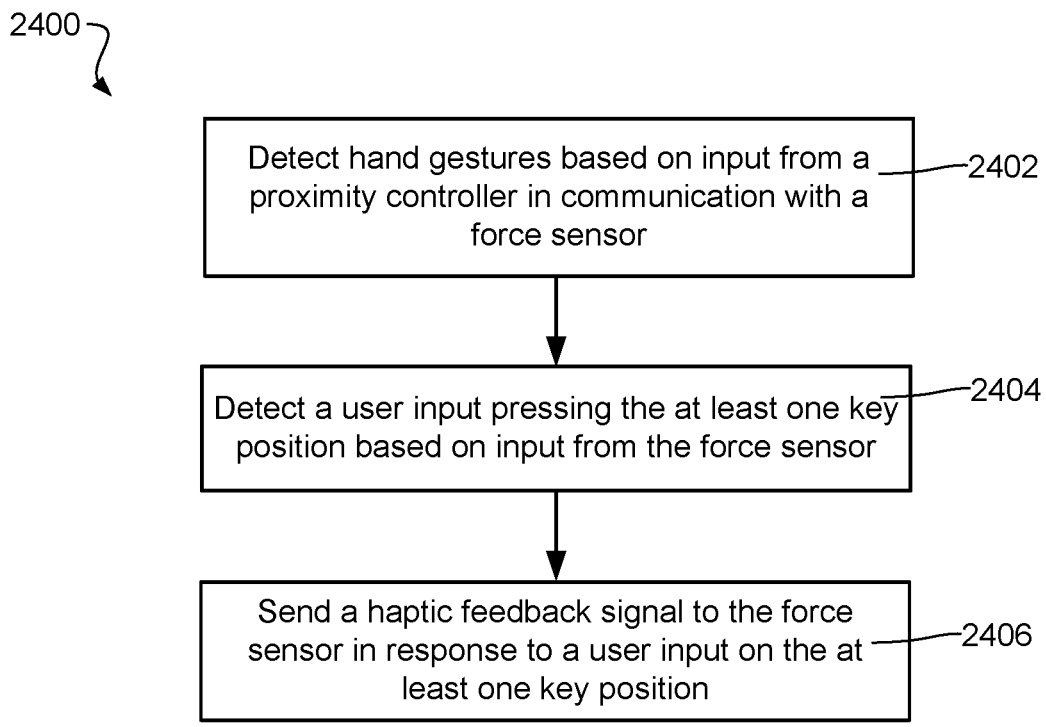
FIG. 24 depicts an example of detecting a user input according to the present disclosure.

FIG. 24 depicts an example of a method 2400 of detecting hand gestures according to the present disclosure. This method 2400 may be performed based on the description of the devices, module, and principles described in relation to FIGS. 1-18. In this example, the method 2400 includes detecting 2402 hand gestures based on input from a proximity controller in communication with a force sensor, detecting 2404 a user input pressing the at least one key position based on input from the force sensor, and sending 2406 a haptic feedback signal to the force sensor in response to a user input on the at least one key position.

Figure 25:
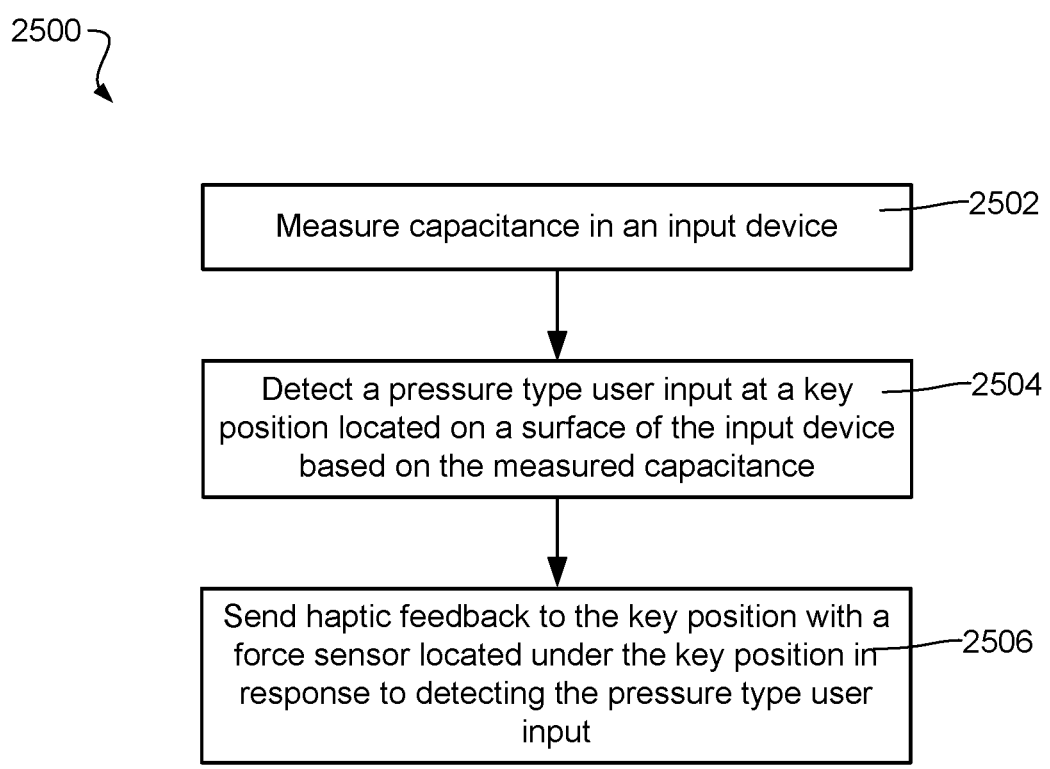
FIG. 25 depicts an example of detecting a pressure type user input according to the present disclosure.

FIG. 25 depicts an example of a method 2500 of detecting hand gestures according to the present disclosure. This method 2500 may be performed based on the description of the devices, module, and principles described in relation to FIGS. 1-18. In this example, the method 2500 includes measuring 2502 capacitance in an input device, detecting 2504 a pressure type user input at a key position located on a surface of the input device based on the measured capacitance, and sending 2506 haptic feedback to the key position with a force sensor located under the key position in response to detecting the pressure type user input.

These components may, individually or collectively, be implemented with one or more Application Specific Integrated Circuits (ASICs) adapted to perform some or all of the applicable functions in hardware. Alternatively, the functions may be performed by one or more other processing units (or cores), on one or more integrated circuits. In other embodiments, other types of integrated circuits may be used (e.g., Structured/Platform ASICs, Field Programmable Gate Arrays (FPGAs) and other Semi-Custom ICs), which may be programmed in any manner known in the art. The functions of each unit may also be implemented, in whole or in part, with instructions embodied in a memory, formatted to be executed by one or more general or application-specific processors.

It should be noted that the methods, systems and devices discussed above are intended merely to be examples. It must be stressed that various embodiments may omit, substitute, or add various procedures or components as appropriate. For instance, it should be appreciated that, in alternative embodiments, the methods may be performed in an order different from that described, and that various steps may be added, omitted or combined. Also, features described with respect to certain embodiments may be combined in various other embodiments. Different aspects and elements of the embodiments may be combined in a similar manner. Also, it should be emphasized that technology evolves and, thus, many of the elements are exemplary in nature and should not be interpreted to limit the scope of the invention.

Specific details are given in the description to provide a thorough understanding of the embodiments. However, it will be understood by one of ordinary skill in the art that the embodiments may be practiced without these specific details. For example, well-known circuits, processes, algorithms, structures, and techniques have been shown without unnecessary detail in order to avoid obscuring the embodiments.

Also, it is noted that the embodiments may be described as a process which is depicted as a flow diagram or block diagram. Although each may describe the operations as a sequential process, many of the operations can be performed in parallel or concurrently. In addition, the order of the operations may be rearranged. A process may have additional steps not included in the figure.

Moreover, as disclosed herein, the term "memory" or "memory unit" may represent one or more devices for storing data, including read-only memory (ROM), random access memory (RAM), magnetic RAM, core memory, magnetic disk storage mediums, optical storage mediums, flash memory devices or other computer-readable mediums for storing information. The term "computer-readable medium" includes, but is not limited to, portable or fixed storage devices, optical storage devices, wireless channels, a sim card, other smart cards, and various other mediums capable of storing, containing or carrying instructions or data.

Furthermore, embodiments may be implemented by hardware, software, firmware, middleware, microcode, hardware description languages, or any combination thereof. When implemented in software, firmware, middleware or microcode, the program code or code segments to perform the necessary tasks may be stored in a computer-readable medium such as a storage medium. Processors may perform the necessary tasks.

Having described several embodiments, it will be recognized by those of skill in the art that various modifications, alternative constructions, and equivalents may be used without departing from the spirit of the invention. For example, the above elements may merely be a component of a larger system, wherein other rules may take precedence over or otherwise modify the application of the invention. Also, a number of steps may be undertaken before, during, or after the above elements are considered. Accordingly, the above description should not be taken as limiting the scope of the invention.

The invention claimed is:

1. An apparatus, including:
an input surface;
a force sensor positioned underneath the input surface; and
the force sensor including:
a piezoelectric material,
a first electrically conductive material located on a first side of the piezoelectric material;
a second electrically conductive material located on a second side, opposite of the first side, of the piezoelectric material;
the first electrically conductive material and the second electrically conductive material are each in communication with a proximity controller, which is programmed to measure the capacitance between the first electrically conductive material and the second electrically conductive material;
a plurality of key positions on the input surface;
the force sensor positioned underneath the input surface at least one of the key positions;
the force sensor being configured to:
detect a user input pressing on the at least one key position based on the capacitance measurement from between portions of the piezoelectric sensor without relative movement between the input surface and the at least one key position; and
send haptic feedback at the key position with the force sensor located under the key position in response to detecting the user input.

2. The apparatus of claim 1, wherein at least one key position is incorporated into the input surface; and
wherein the force sensor is positioned underneath at least one of the key positions.

3. The apparatus of claim 2, further comprising:
a processor;
memory in communication with the processor;
programmed instructions stored in the memory that, when executed, cause the processor to:
send a haptic feedback signal to the force sensor in response to a user input on the at least one key position.

4. The apparatus of claim 3, wherein the programmed instructions, when executed, cause the processor to:
detect the user input pressing the at least one key position based on input from the proximity controller.

5. The apparatus of claim 3, wherein the programmed instructions, when executed, cause the processor to:
detect hand gestures based on input from the proximity controller.

6. The apparatus of claim 3, wherein the programmed instructions, when executed, cause the processor to:
detect the user input pressing the at least one key position based on input from the force controller.

7. The apparatus of claim 3, wherein the programmed instructions, when executed, cause the processor to:
detect the user input pressing on the at least one key position without relative movement between the input surface and the at least one key position.

8. The apparatus of claim 1, wherein the input surface is a roll up or a foldable surface.

9. The apparatus of claim 1, wherein the plurality of key positions and the input surface are made of a continuous material.

10. A computer-program product for controlling a computing device, the computer-program product comprising a non-transitory computer-readable medium storing instructions executable by a processor to:
measure capacitance in an input device where the capacitance is measured between a first electrically conductive material located on a first side of a piezoelectric sensor and a second electrically conductive material located on a second side, opposite of the first side, of the piezoelectric sensor;
detect a user input at a key position located on a surface of the input device based on the measured capacitance from between portions of the piezoelectric sensor without relative movement between the input surface and the at least one key position; and
send haptic feedback at the key position with the piezoelectric sensor located under the key position in response to detecting the user input.

* * * * *